US012787589B2

(12) United States Patent
Hanari et al.

(10) Patent No.: US 12,787,589 B2
(45) Date of Patent: Nov. 3, 2026

(54) DISPLAY DEVICE

(71) Applicant: Magnolia White Corporation, Tokyo (JP)

(72) Inventors: Jun Hanari, Tokyo (JP); Hidekazu Miyake, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 235 days.

(21) Appl. No.: 18/673,339

(22) Filed: May 24, 2024

(65) Prior Publication Data

US 2024/0397781 A1 Nov. 28, 2024

(30) Foreign Application Priority Data

May 26, 2023 (JP) ................................ 2023-086843

(51) Int. Cl.
*H10K 59/35* (2023.01)

(52) U.S. Cl.
CPC ................................ *H10K 59/353* (2023.02)

(58) Field of Classification Search
CPC .. H10K 59/353; H10K 59/122; H10K 59/173; H10K 59/131; H10K 59/35
See application file for complete search history.

(56) References Cited

U.S. PATENT DOCUMENTS

| | | | | |
|---|---|---|---|---|
| 6,420,834 | B2 * | 7/2002 | Yamazaki | H10D 86/0221 315/169.3 |
| 6,559,594 | B2 * | 5/2003 | Fukunaga | H10D 86/0231 313/506 |
| 2004/0160170 | A1 | 8/2004 | Sato et al. | |
| 2009/0009069 | A1 | 1/2009 | Takata | |
| 2014/0103385 | A1 * | 4/2014 | Hatano | H10H 20/01 438/28 |
| 2019/0229293 | A1 * | 7/2019 | Ueda | H10K 59/122 |
| 2019/0363275 | A1 | 11/2019 | Ochi et al. | |
| 2022/0077251 | A1 | 3/2022 | Choung et al. | |

FOREIGN PATENT DOCUMENTS

| | | | |
|---|---|---|---|
| JP | 2000-195677 | A | 7/2000 |
| JP | 2004-207217 | A | 7/2004 |
| JP | 2008-135325 | A | 6/2008 |
| JP | 2009-032673 | A | 2/2009 |
| JP | 2010-118191 | A | 5/2010 |
| WO | 2018/179308 | A1 | 10/2018 |

* cited by examiner

*Primary Examiner* — Syed I Gheyas
(74) *Attorney, Agent, or Firm* — XSENSUS LLP

(57) ABSTRACT

According to one embodiment, a display device includes subpixels each including a lower electrode, an upper electrode and an organic layer, and a partition which includes a lower portion and an upper portion protruding from a side surface of the lower portion and surrounds each of the subpixels. The partition includes a first partition in which the lower portion includes first and second conductive layers which overlap each other, and a second partition in which the lower portion includes an insulating layer and the second conductive layer provided on the insulating layer. Further, a slit is provided in at least part of the second partition.

20 Claims, 30 Drawing Sheets

DISPLAY DEVICE

CROSS-REFERENCE TO RELATED APPLICATION

This application is based upon and claims the benefit of priority from Japanese Patent Application No. 2023-086843, filed May 26, 2023, the entire contents of which are incorporated herein by reference.

FIELD

Embodiments described herein relate generally to a display device.

BACKGROUND

Recently, display devices to which an organic light emitting diode (OLED) is applied as a display element have been put into practical use. This display element comprises a lower electrode, an organic layer which covers the lower electrode, and an upper electrode which covers the organic layer. Common voltage is applied to the upper electrode of each display element through lines provided in a display area. These upper electrodes and lines constitute a common electrode which overlaps the display area as a whole.

In some cases, an antenna which transmits and receives radio waves for near field communication (NFC) is incorporated into an electronic device comprising a display device in a state where the antenna overlaps the display device. In this case, eddy current could occur in the common electrode because of a magnetic field generated by the antenna. If the resistance of the common electrode is low, the magnetic field generated by eddy current becomes strong and may be a cause of interruption of communication performed by the antenna.

DETAILED DESCRIPTION

Figure 1:
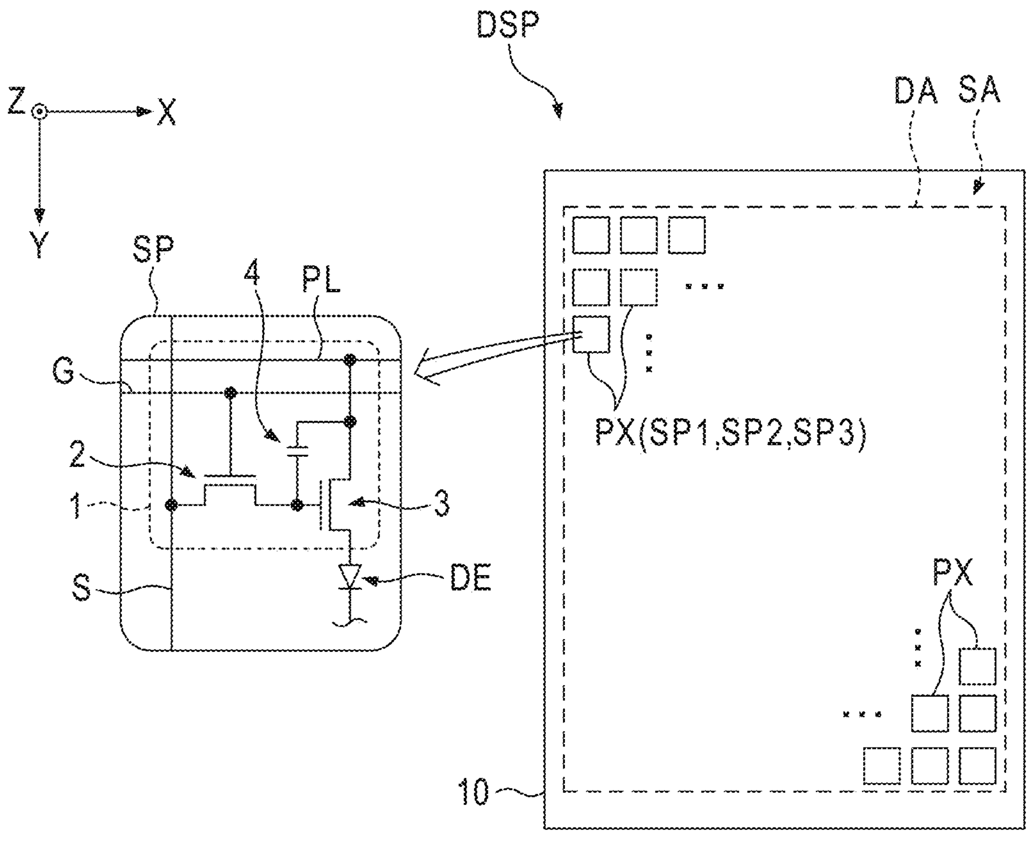
FIG. 1 is a diagram showing a configuration example of a display device according to a first embodiment.

In general, according to one embodiment, a display device comprises a plurality of subpixels each including a lower electrode, an upper electrode which faces the lower electrode, and an organic layer which is provided between the lower electrode and the upper electrode and emits light based on a potential difference between the lower electrode and the upper electrode, and a partition which includes a lower portion and an upper portion protruding from a side surface of the lower portion and surrounds each of the subpixels.

In the embodiment, the partition comprises a first partition in which the lower portion includes first and second conductive layers which overlap each other, and a second partition in which the lower portion includes an insulating layer and the second conductive layer provided on the insulating layer. Further, a slit is provided in at least part of the second partition.

In another embodiment, the partition comprises a first partition in which the lower portion has a first height, and a second partition in which the lower portion has a second height less than the first height. Further, a slit is provided in at least part of the second partition.

One of the objects of the embodiments described herein is to provide a display device comprising an improved interconnection structure.

Embodiments will be described with reference to the accompanying drawings.

The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes, etc., of the respective parts are illustrated schematically in the drawings, rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction X. A direction parallel to the Y-axis is referred to as a second direction Y. A direction parallel to the Z-axis is referred to as a third direction Z. The third direction Z is a normal direction relative to a plane including the first direction X and the second direction Y. When various elements are viewed parallel to the third direction Z, the appearance is defined as a plan view. The direction indicated by the arrow of the Z-axis may be referred to as the upper side, and the opposite direction may be referred to as the lower side. The state defined by terms indicating the positional relationships of two or more structural elements, such as "on", "above" and "face", could include the state in which these structural elements are spaced apart from each other as a gap or another structural element is interposed between them in addition to the state in which the structural elements are directly in contact with each other.

The display device of each embodiment is an organic electroluminescent display device comprising an organic light emitting diode (OLED) as a display element, and could be mounted on various types of electronic devices such as a television, a personal computer, a vehicle-mounted device, a tablet, a smartphone, a mobile phone and a wearable terminal.

First Embodiment

FIG. 1 is a diagram showing a configuration example of a display device DSP according to a first embodiment. The display device DSP comprises an insulating substrate 10. The substrate 10 has a display area DA which displays an image, and a surrounding area SA around the display area DA. The substrate 10 may be glass or a resinous film having flexibility.

In the embodiment, the substrate 10 is rectangular as seen in plan view. It should be noted that the shape of the substrate 10 in plan view is not limited to a rectangle and may be another shape such as a square, a circle or an oval.

The display area DA comprises a plurality of pixels PX arrayed in matrix in a first direction X and a second direction Y. Each pixel PX includes a plurality of subpixels SP which display different colors. This embodiment assumes a case where each pixel PX includes a blue subpixel SP1, a green subpixel SP2 and a red subpixel SP3. Here, subpixels SP1, SP2 and SP3 are examples of first, second and third subpixels. Further, blue, green and red are examples of first, second and third colors. Each pixel PX may include a subpixel SP which exhibits another color such as white or yellow. The number of subpixels SP constituting each pixel PX is not limited to three.

Each subpixel SP comprises a pixel circuit 1 and a display element DE driven by the pixel circuit 1. The pixel circuit 1 comprises a pixel switch 2, a drive transistor 3 and a capacitor 4. Each of the pixel switch 2 and the drive transistor 3 is, for example, a switching element consisting of a thin-film transistor.

A plurality of scanning lines G which supply a scanning signal to the pixel circuits 1 of the subpixels SP, a plurality of signal lines S which supply a video signal to the pixel circuits 1 of the subpixels SP and a plurality of power lines PL are provided in the display area DA. In the example of FIG. 1, the scanning lines G and the power lines PL extend in the first direction X, and the signal lines S extend in the second direction Y.

The gate electrode of the pixel switch 2 is connected to the scanning line G. One of the source electrode and drain electrode of the pixel switch 2 is connected to the signal line S. The other one is connected to the gate electrode of the drive transistor 3 and the capacitor 4. In the drive transistor 3, one of the source electrode and the drain electrode is connected to the power line PL and the capacitor 4, and the other one is connected to the display element DE.

It should be noted that the configuration of the pixel circuit 1 is not limited to the example shown in the figure. For example, the pixel circuit 1 may comprise more thin-film transistors and capacitors.

Figure 2:
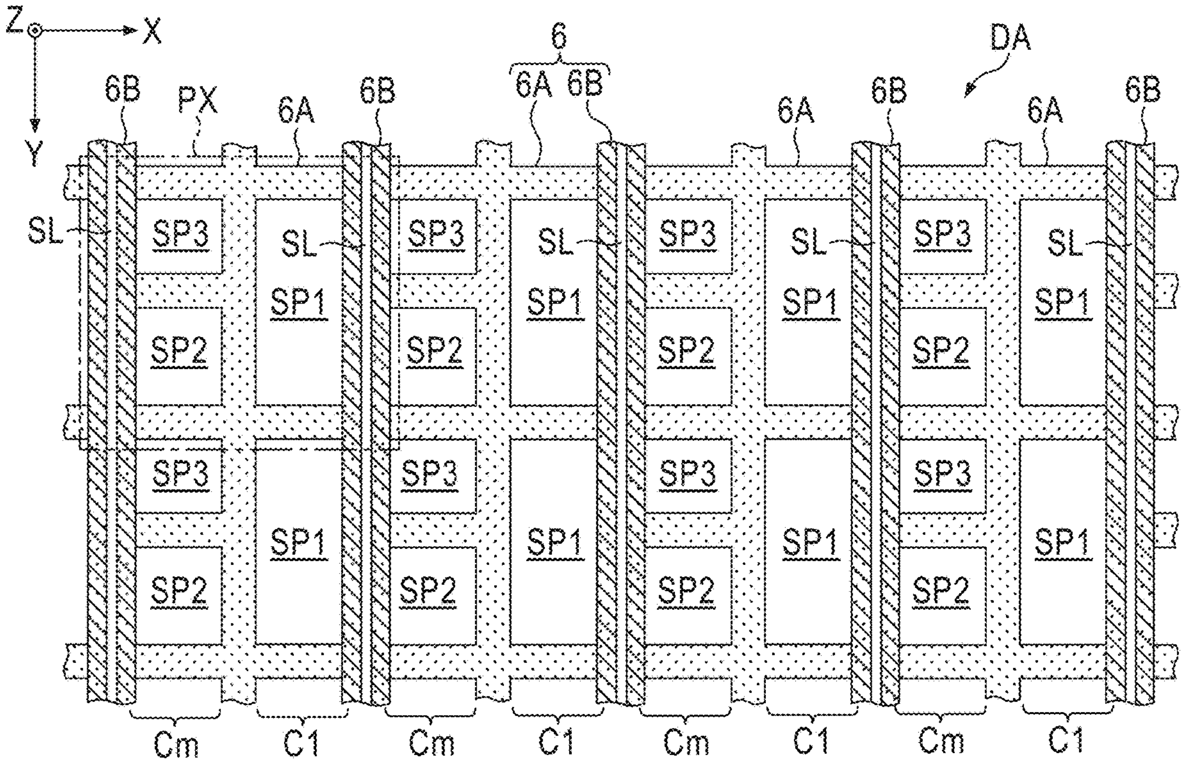
FIG. 2 is a schematic plan view of a display area according to the first embodiment.

FIG. 2 is a schematic plan view of the display area DA according to the embodiment. A conductive partition 6 is provided in the display area DA. The partition 6 functions as lines which apply common voltage to the display elements DE. The partition 6 has a grating shape which surrounds subpixels SP1, SP2 and SP3.

In the example of FIG. 2, pixel columns C1 each of which includes a plurality of subpixels SP1 and pixel columns Cm each of which includes a plurality of subpixels SP2 and SP3 are formed in the display area DA. The pixel columns C1 and Cm are alternately arranged in the first direction X. In each pixel column C1, a plurality of subpixels SP1 are arranged in the second direction Y. In each pixel column Cm, subpixels SP2 and SP3 are alternately arranged in the second direction Y.

In the embodiment, the partition 6 has a plurality of first partitions 6A and a plurality of second partitions 6B which extend parallel to each other (the portions shown by diagonal lines). The detailed structures of these partitions 6A and 6B are described later using FIG. 5.

The second partitions 6B linearly extend in the second direction Y and are arranged at intervals in the first direction X. A slit SL is provided in at least one of the second partitions 6B. In FIG. 2, all of the second partitions 6B have their respective slits SL. However, the configuration is not limited to this example. Each slit SL extends in the extension direction of the second partitions 6B (in FIG. 2, the second direction Y).

One pixel column Cm and one pixel column C1 are provided between adjacent two second partitions 6B. Each first partition 6A is formed along the boundaries of subpixels SP1, SP2 and SP3 located between adjacent two second partitions 6B.

Figure 3:
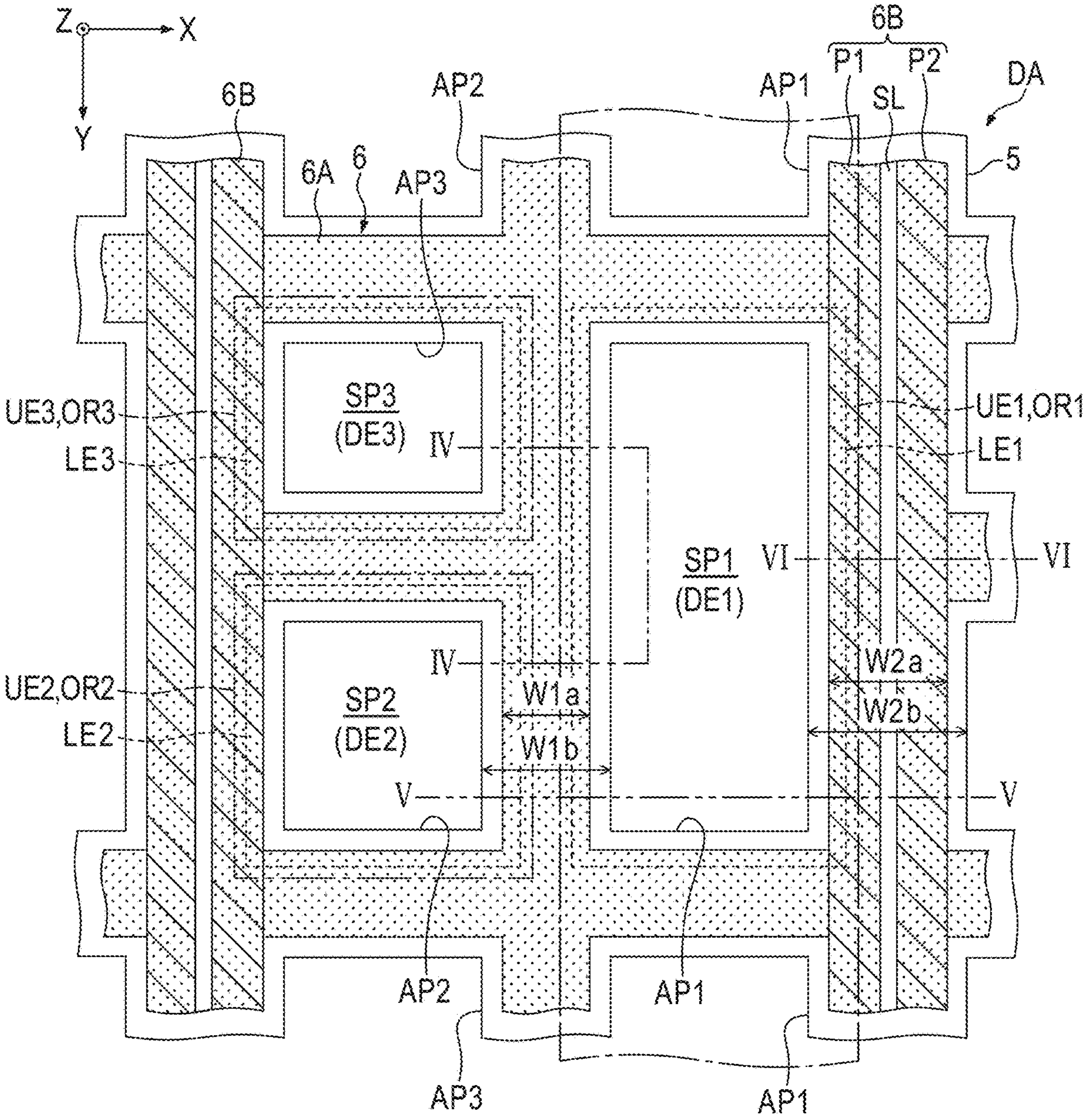
FIG. 3 is a schematic plan view in which the pixels shown in FIG. 2 are enlarged.

FIG. 3 is a schematic plan view in which the pixels PX surrounded by the chained frame in FIG. 2 are enlarged. A rib 5 is provided in the display area DA. The partition 6 overlaps the rib 5 as a whole. The rib 5 has pixel apertures AP1, AP2 and AP3 in subpixels SP1, SP2 and SP3, respectively.

In the example of FIG. 3, the pixel aperture AP1 is larger than the pixel aperture AP2. The pixel aperture AP2 is larger than the pixel aperture AP3. Thus, among subpixels SP1, SP2 and SP3, the aperture ratio of subpixel SP1 is the greatest, and the aperture ratio of subpixel SP3 is the least.

Subpixel SP1 comprises a lower electrode LE1, an upper electrode UE1 and an organic layer OR1 overlapping the pixel aperture AP1. Subpixel SP2 comprises a lower electrode LE2, an upper electrode UE2 and an organic layer OR2 overlapping the pixel aperture AP2. Subpixel SP3 comprises a lower electrode LE3, an upper electrode UE3 and an organic layer OR3 overlapping the pixel aperture AP3. The end portions of the lower electrodes LE1, LE2 and LE3, the upper electrodes UE1, UE2 and UE3 and the organic layers OR1, OR2 and OR3 overlap the rib 5 and the partition 6 as a whole.

Of the lower electrode LE1, the upper electrode UE1 and the organic layer OR1, the portions which overlap the pixel aperture AP1 constitute the display element DE1 of subpixel SP1. Of the lower electrode LE2, the upper electrode UE2 and the organic layer OR2, the portions which overlap the pixel aperture AP2 constitute the display element DE2 of subpixel SP2. Of the lower electrode LE3, the upper electrode UE3 and the organic layer OR3, the portions which overlap the pixel aperture AP3 constitute the display element DE3 of subpixel SP3. Each of the display elements DE1, DE2 and DE3 may further include a cap layer as described later. The rib 5 and the partition 6 surround each of these display elements DE1, DE2 and DE3.

For example, the upper electrode UE1 and the organic layer OR1 are formed over a plurality of subpixels SP1 arranged in the second direction Y. As another example, the upper electrode UE1 and organic layer OR1 of adjacent subpixels SP1 may be divided on the partition 6.

Each of subpixels SP1, SP2 and SP3 (display elements DE1, DE2 and DE3) has a rectangular shape. In each of subpixels SP1, SP2 and SP3, at least one of the four sides faces the first partition 6A. In the example of FIG. 3, three sides of each of subpixels SP1, SP2 and SP3 faces the first partition 6A, and the remaining side faces the second partition 6B.

The first partition 6A has width W1*a*, and each second partition 6B has width W2*a*. In the rib 5, the portion located under the first partition 6A has width W1*b*, and the portion located under each second partition 6B has width W2*b*. Width W1*b* is greater than width W1*a* (W1*a*<W1*b*). Width W2*b* is greater than width W2*a* (W2*a*<W2*b*). In the example of FIG. 3, width W2*a* is greater than width W1*a* (W1*a*<W2*a*). Width W2*b* is greater than width W1*b* (W1*b*<W2*b*). It should be noted that the relationships of the widths of the partitions 6A and 6B and the rib 5 are not limited to this example.

Each second partition 6B is divided into a first portion P1 and a second portion P2 by the slit SL. The widths of the first portion P1 and the second portion P2 are, for example, equal to each other. However, they may be different from each other. In the example of FIG. 3, the width of each slit SL is less than that of each of the first portion P1 and the second portion P2. Width W2*a* described above corresponds to the total width of the first portion P1, the second portion P2 and the slit SL.

Figure 4:
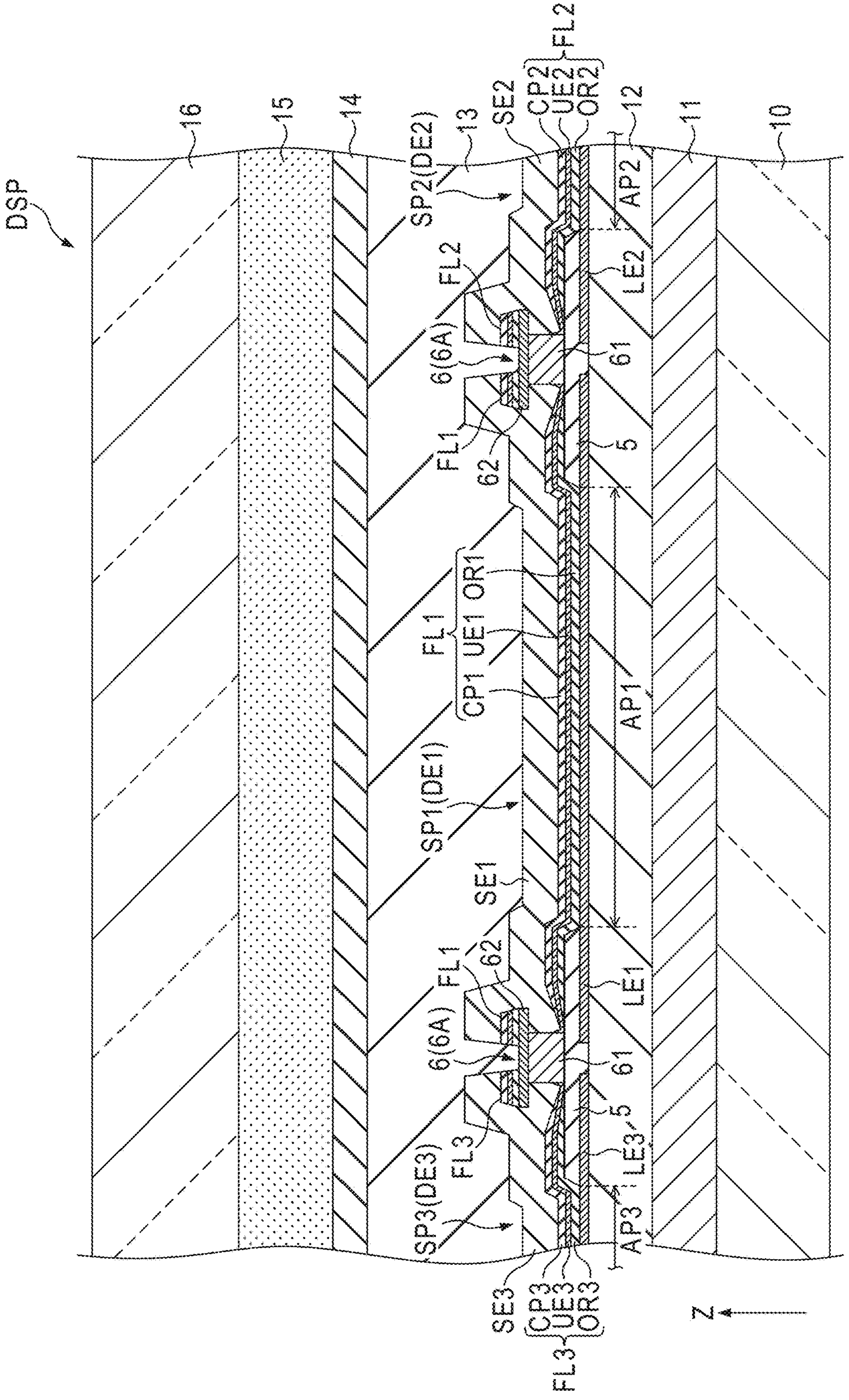
FIG. 4 is a schematic cross-sectional view of the display device along the IV-IV line of FIG. 3.

FIG. 4 is a schematic cross-sectional view of the display device DSP along the IV-IV line of FIG. 3. A circuit layer 11 is provided on the substrate 10 described above. The circuit layer 11 includes various circuits and lines such as the pixel circuits 1, scanning lines G, signal lines S and power lines PL shown in FIG. 1. The circuit layer 11 is covered with an organic insulating layer 12. The organic insulating layer 12 functions as a planarization film which planarizes the irregularities formed by the circuit layer 11.

The lower electrodes LE1, LE2 and LE3 are provided on the organic insulating layer 12. The rib 5 is provided on the organic insulating layer 12 and the lower electrodes LE1, LE2 and LE3. The end portions of the lower electrodes LE1, LE2 and LE3 are covered with the rib 5. Although not shown in the section of FIG. 4, the lower electrodes LE1, LE2 and LE3 are connected to the respective pixel circuits 1 of the circuit layer 11 through respective contact holes provided in the organic insulating layer 12.

The partition 6 includes a conductive lower portion 61 provided on the rib 5 and an upper portion 62 provided on the lower portion 61. The upper portion 62 has a width greater than that of the lower portion 61. By this configuration, the both end portions of the upper portion 62 protrude relative to the side surfaces of the lower portion 61. This shape of the partition 6 is called an overhang shape.

The organic layer OR1 covers the lower electrode LE1 through the pixel aperture AP1. The upper electrode UE1 covers the organic layer OR1 and faces the lower electrode LE1. The organic layer OR2 covers the lower electrode LE2 through the pixel aperture AP2. The upper electrode UE2 covers the organic layer OR2 and faces the lower electrode LE2. The organic layer OR3 covers the lower electrode LE3 through the pixel aperture AP3. The upper electrode UE3 covers the organic layer OR3 and faces the lower electrode LE3. The upper electrodes UE1, UE2 and UE3 are in contact with the side surfaces of the lower portions 61 of the partition 6.

The display element DE1 includes a cap layer CP1 provided on the upper electrode UE1. The display element DE2 includes a cap layer CP2 provided on the upper electrode UE2. The display element DE3 includes a cap layer CP3 provided on the upper electrode UE3. The cap layers CP1, CP2 and CP3 function as optical adjustment layers which improve the extraction efficiency of the light emitted from the organic layers OR1, OR2 and OR3, respectively.

In the following explanation, a multilayer body including the organic layer OR1, the upper electrode UE1 and the cap layer CP1 is called a stacked film FL1. A multilayer body including the organic layer OR2, the upper electrode UE2 and the cap layer CP2 is called a stacked film FL2. A multilayer body including the organic layer OR3, the upper electrode UE3 and the cap layer CP3 is called a stacked film FL3.

The stacked film FL1 is partly located on the upper portion 62. This portion is spaced apart from, of the stacked film FL1, the portion located under the partition 6 (in other words, the portion which constitutes the display element DE1). Similarly, the stacked film FL2 is partly located on the upper portion 62. This portion is spaced apart from, of the stacked film FL2, the portion located under the partition 6 (in other words, the portion which constitutes the display element DE2). Further, the stacked film FL3 is partly located on the upper portion 62. This portion is spaced apart from, of the stacked film FL3, the portion located under the partition 6 (in other words, the portion which constitutes the display element DE3).

Sealing layers SE1, SE2 and SE3 are provided in subpixels SP1, SP2 and SP3, respectively. The sealing layer SE1 continuously covers the stacked film FL1 and the partition 6 around subpixel SP1. The sealing layer SE2 continuously covers the stacked film FL2 and the partition 6 around subpixel SP2. The sealing layer SE3 continuously covers the stacked film FL3 and the partition 6 around subpixel SP3.

In the example of FIG. 4, the stacked film FL1 and sealing layer SE1 located on the partition 6 between subpixels SP1 and SP2 are spaced apart from the stacked film FL2 and sealing layer SE2 located on this partition 6. The stacked film FL1 and sealing layer SE1 located on the partition 6 between subpixels SP1 and SP3 are spaced apart from the stacked film FL3 and sealing layer SE3 located on this partition 6.

It should be noted that the partition 6 functions as lines for supplying electricity to the upper electrodes UE1, UE2 and UE3 and also functions to divide the stacked films FL1, FL2 and FL3 which are formed by vapor deposition when the display device DSP is manufactured. By dividing the stacked films FL1, FL2 and FL3 in this manner, the display elements DE1, DE2 and DE3 which are individually sealed with the sealing layers SE1, SE2 and SE3 can be obtained.

The sealing layers SE1, SE2 and SE3 are covered with a resin layer 13. The irregularities formed by the partition 6 and the like are planarized by the resin layer 13. The resin layer 13 is covered with a sealing layer 14. The resin layer 13 and the sealing layer 14 are continuously provided in at least the entire display area DA and partly extend in the surrounding area SA as well. In the example of FIG. 4, a cover member 16 is attached to the sealing layer 14 by an adhesive layer 15. As another example, a resin layer may be further provided on the sealing layer 14.

The organic insulating layer 12 is formed of an organic insulating material such as polyimide. Each of the rib 5 and the sealing layers 14, SE1, SE2 and SE3 is formed of an inorganic insulating material such as silicon nitride (SiNx), silicon oxide (SiOx), silicon oxynitride (SiON) or aluminum oxide ($Al_2O_3$). For example, the rib 5 is formed of silicon oxynitride, and each of the sealing layers 14, SE1, SE2 and SE3 is formed of silicon nitride. The resin layer 13 is formed of, for example, a resinous material (organic insulating material) such as epoxy resin or acrylic resin.

For example, an optical clear adhesive (OCA) can be used for the adhesive layer 15. For example, a polarizer, a touch panel, a protective film or a cover glass can be used for the cover member 16. The cover member 16 may comprise a stacked structure of at least two of these polarizer, touch panel, protective film and cover glass.

Each of the lower electrodes LE1, LE2 and LE3 comprises a reflective layer formed of, for example, silver (Ag), and a pair of conductive oxide layers covering the upper and lower surfaces of the reflective layer. Each conductive oxide layer can be formed of, for example, a transparent conductive oxide such as indium tin oxide (ITO), indium zinc oxide (IZO) or indium gallium zinc oxide (IGZO).

Each of the upper electrodes UE1, UE2 and UE3 is formed of, for example, a metal material such as an alloy of magnesium and silver (MgAg). For example, the lower electrodes LE1, LE2 and LE3 correspond to anodes, and the upper electrodes UE1, UE2 and UE3 correspond to cathodes.

For example, each of the organic layers OR1, OR2 and OR3 comprises a multilayer structure consisting of a hole injection layer, a hole transport layer, an electron blocking layer, a light emitting layer, a hole blocking layer, an electron transport layer and an electron injection layer. Each of the organic layers OR1, OR2 and OR3 may comprise a tandem structure including a plurality of light emitting layers.

Each of the cap layers CP1, CP2 and CP3 comprises, for example, a multilayer structure in which a plurality of transparent thin films are stacked. The thin films may include a thin film formed of an inorganic material and a thin film formed of an organic material. These thin films have refractive indices different from each other. For example, the refractive indices of these thin films are different from the refractive indices of the upper electrodes UE1, UE2 and UE3 and the refractive indices of the sealing layers SE1, SE2 and SE3. It should be noted that at least one of the cap layers CP1, CP2 and CP3 may be omitted.

Common voltage is applied to the partition 6. This common voltage is applied to each of the upper electrodes UE1, UE2 and UE3 which are in contact with the side surfaces of the lower portions 61 of the first partition 6A. Pixel voltage is applied to the lower electrodes LE1, LE2 and LE3 through the pixel circuits 1 provided in subpixels SP1, SP2 and SP3, respectively, based on the video signals of the signal lines S.

The organic layers OR1, OR2 and OR3 emit light based on the application of voltage. Specifically, when a potential difference is formed between the lower electrode LE1 and the upper electrode UE1, the light emitting layer of the organic layer OR1 emits light in a blue wavelength range. When a potential difference is formed between the lower electrode LE2 and the upper electrode UE2, the light emitting layer of the organic layer OR2 emits light in a green wavelength range. When a potential difference is formed between the lower electrode LE3 and the upper electrode UE3, the light emitting layer of the organic layer OR3 emits light in a red wavelength range.

As another example, the light emitting layers of the organic layers OR1, OR2 and OR3 may emit light exhibiting the same color (for example, white). In this case, the display device DSP may comprise color filters which convert the light emitted from the light emitting layers into light exhibiting colors corresponding to subpixels SP1, SP2 and SP3. The display device DSP may comprise a layer including quantum dots which generate light exhibiting colors corresponding to subpixels SP1, SP2 and SP3 by the excitation caused by the light emitted from the light emitting layers.

Figure 5:
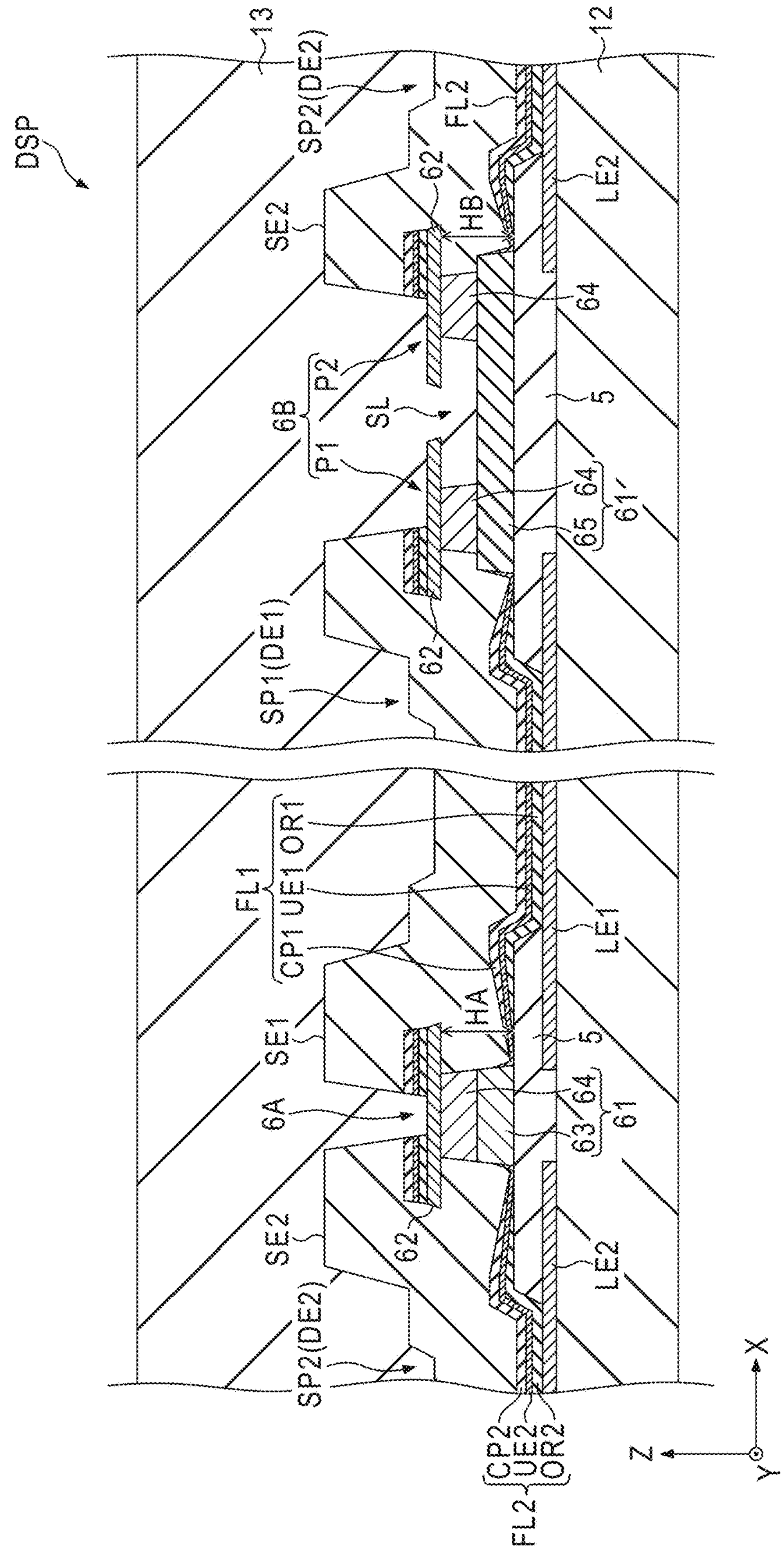
FIG. 5 is a schematic cross-sectional view of the display device along the V-V line of FIG. 3.

FIG. 5 is a schematic cross-sectional view of the display device DSP along the V-V line of FIG. 3. In this figure, the illustrations of the substrate 10, the circuit layer 11, the sealing layer 14, the adhesive layer 15 and the cover member 16 are omitted.

The lower portion 61 of the first partition 6A has a first conductive layer 63 provided on the rib 5 and a second conductive layer 64 provided on the first conductive layer 63. The lower portion 61 of the second partition 6B has an insulating layer 65 provided on the rib 5 and the second conductive layer 64 provided on the insulating layer 65, and does not have the first conductive layer 63.

The slit SL divides the upper portion 62 and second conductive layer 64 of the second partition 6B. Thus, the upper portion 62 and second conductive layer 64 of the first portion P1 are spaced apart from the upper portion 62 and second conductive layer 64 of the second portion P2 via the slit SL. In each of the first portion P1 and the second portion P2, the both end portions of the upper portion 62 protrude from the side surfaces of the second conductive layer 64.

The insulating layer 65 is not divided by the slit SL. Thus, the second conductive layer 64 of the first portion P1 and the second conductive layer 64 of the second portion P2 are provided on the insulating layer 65 which is continuously formed in the width direction of the second partition 6B (in FIG. 5, the first direction X). For example, the both end portions of the insulating layer 65 are located under the upper portions 62 of the first portion P1 and the second portion P2, respectively.

In the example of FIG. 5, each side surface of the first conductive layer 63 of the first partition 6A is aligned with a corresponding side surface of the second conductive layer 64. In the second partition 6B, the both end portions of the insulating layer 65 protrude from the side surfaces of the second conductive layers 64 of the first portion P1 and the second portion P2, respectively.

In the example of FIG. 5, the thickness of the first conductive layer 63 is equal to that of the insulating layer 65. In addition, the thickness of the second conductive layer 64 of the first partition 6A is equal to that of the second conductive layer 64 of the second partition 6B. Thus, height HA of the lower portion 61 of the first partition 6A (the distance from the upper surface of the rib 5 to the upper portion 62 of the first partition 6A) is equal to height HB of the lower portion 61 of the second partition 6B (the distance from the upper surface of the rib 5 to the upper portions 62 of the first portion P1 and the second portion P2).

Each of the upper electrodes UE1 and UE2 is in contact with a corresponding side surface of the first conductive layer 63 of the first partition 6A above the rib 5 located on the left side of the figure. Although not shown in the section of FIG. 5, the upper electrode UE3 is also in contact with the side surface of the first conductive layer 63 of the first partition 6A facing subpixel SP3. Each of the upper electrodes UE1, UE2 and UE3 may be further in contact with a corresponding side surface of the second conductive layer 64 of the first partition 6A.

Each of the upper electrodes UE1 and UE2 is in contact with a corresponding side surface of the insulating layer 65 of the second partition 6B above the rib 5 located on the right side of the figure. Although not shown in the section of FIG. 5, the upper electrode UE3 is also in contact with the side surface of the insulating layer 65 of the second partition 6B facing subpixel SP3. None of the upper electrodes UE1, UE2 and UE3 is in contact with the side surfaces of the second conductive layers 64 of the second partition 6B.

In this configuration of the partition 6, common voltage is applied to the upper electrodes UE1, UE2 and UE3 mainly by the first partition 6A. While the upper electrodes UE1, UE2 and UE3 are electrically connected to the second partition 6B via the first partition 6A, they are not directly electrically connected to each other.

To prevent undesired leak current, it is preferable that the organic layer OR1, OR2 or OR3 should not be in contact with the first conductive layer 63 of the first partition 6A. In the example of FIG. 5, the organic layers OR1, OR2 and OR3 are spaced apart from the insulating layer 65. However, the organic layers OR1, OR2 and OR3 may be in contact with the insulating layer 65.

In the space between the first portion P1 and the second portion P2, none of the stacked films FL1, FL2 and FL3 and the sealing layers SE1, SE2 and SE3 is provided. For example, this space is filled with the resin layer 13. As another example, part of the stacked films FL1, FL2 and FL3 and the sealing layers SE1, SE2 and SE3 may be provided in this space. In this case, it is preferable that the first portion P1 and the second portion P2 should not be electrically connected to each other via the upper electrode UE1, UE2 or UE3.

Each of the first conductive layer 63 and the second conductive layer 64 is formed of, for example, a metal material. For the metal material, for example, aluminum (Al), an aluminum-neodymium alloy (AlNd), an aluminum-yttrium alloy (AlY) or an aluminum-silicon alloy (AlSi) can be used. The first conductive layer 63 and the second conductive layer 64 may be formed of the same material or may be formed of different materials.

The upper portion 62 is formed of, for example, a metal material. For the metal material, for example, titanium (Ti), titanium nitride (TiN), molybdenum (Mo), tungsten (W), a molybdenum-tungsten alloy (MoW) or a molybdenum-niobium alloy (MoNb) can be used. The upper portion 62 may comprise a stacked structure consisting of a lower layer formed of these metal materials and an upper layer formed of conductive oxide. For the conductive oxide, for example, ITO or IZO can be used. It should be noted that the upper portion 62 may include a layer formed of an insulating material.

The insulating layer 65 is formed of, for example, an inorganic insulating material such as silicon nitride, silicon oxide or silicon oxynitride. The insulating layer 65 may be formed of an organic insulating material.

Figure 6:
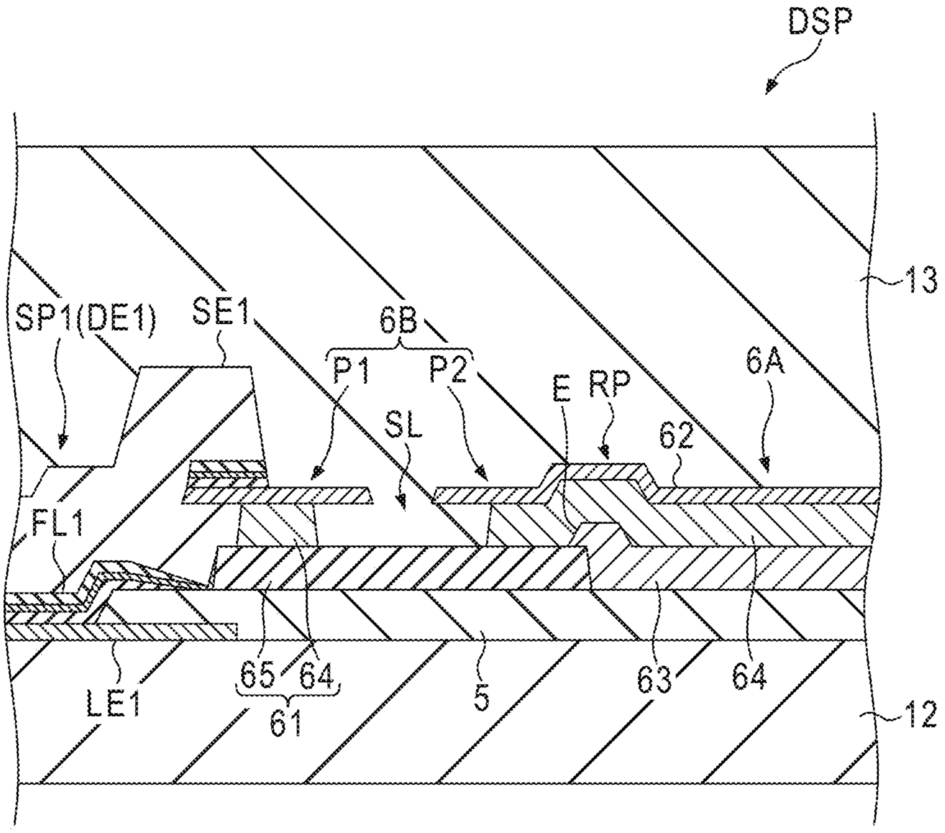
FIG. 6 is a schematic cross-sectional view of the display device along the VI-VI line of FIG. 3.

FIG. 6 is a schematic cross-sectional view of the display device DSP along the VI-VI line of FIG. 3 and shows the structure of the vicinity of the boundary between the first partition 6A and the second partition 6B. The second conductive layer 64 of the first partition 6A and the second conductive layer 64 of the second partition 6B (in FIG. 6, the second conductive layer 64 of the second portion P2) are continuous with each other. The upper portion 62 of the first partition 6A and the upper portion 62 of the second partition 6B (in FIG. 6, the upper portion 62 of the second portion P2) are also continuous with each other.

In the example of FIG. 6, an end portion E of the first conductive layer 63 is located on the insulating layer 65. By this structure, a raised portion RP in which the second conductive layer 64 and the upper portion 62 are raised is formed above the end portion E. The configuration is not limited to this example. The end portion E may be located between the insulating layer 65 and the rib 5.

Now, this specification explains the manufacturing method of the display device DSP.

To manufacture the display device DSP, the circuit layer 11, the organic insulating layer 12 and the lower electrodes LE1, LE2 and LE3 are formed in order on the substrate 10. Subsequently, a process for forming the rib 5, the partition 6 and the display elements DE1, DE2 and DE3 is performed.

FIG. 7A to FIG. 7H are schematic cross-sectional views showing a process for forming the rib 5, the partition 6 and the display element DE1. In these figures, the illustrations of the substrate 10 and the circuit layer 11 are omitted.

Figure 7A:
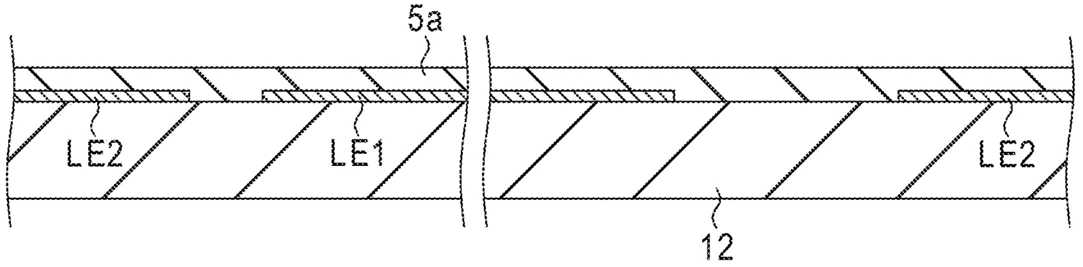
FIG. 7A is a schematic cross-sectional view showing part of the manufacturing process of the display device according to the first embodiment.

First, as shown in FIG. 7A, a rib layer 5*a* which should be processed into the rib 5 is formed. The rib layer 5*a* covers the lower electrodes LE1, LE2 and LE3 as a whole.

Figure 7B:
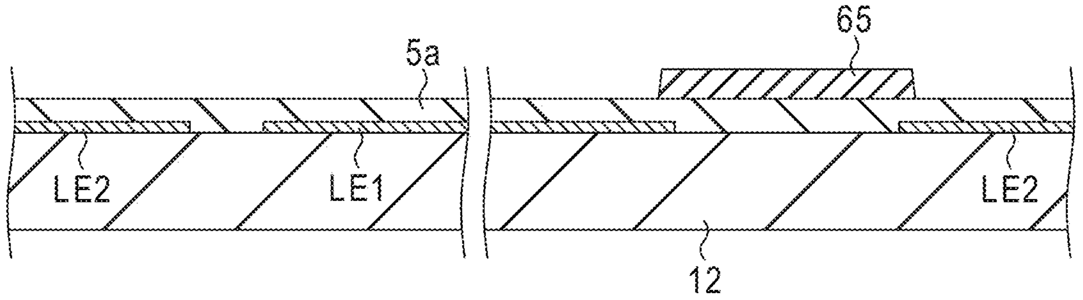
FIG. 7B is a schematic cross-sectional view showing a process following FIG. 7A.
Figure 7C:
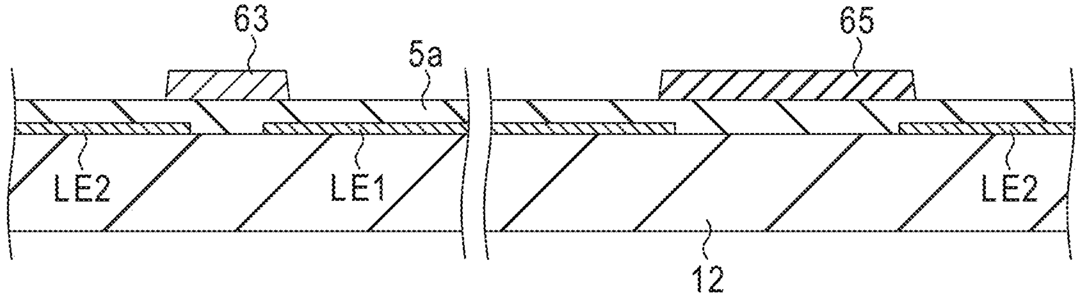
FIG. 7C is a schematic cross-sectional view showing a process following FIG. 7B.

Subsequently, as shown in FIG. 7B, the insulating layer 65 is formed at a position where the second partition 6B should be formed. Further, as shown in FIG. 7C, the first conductive layer 63 is formed at a position where the first partition 6A should be formed.

Figure 7D:
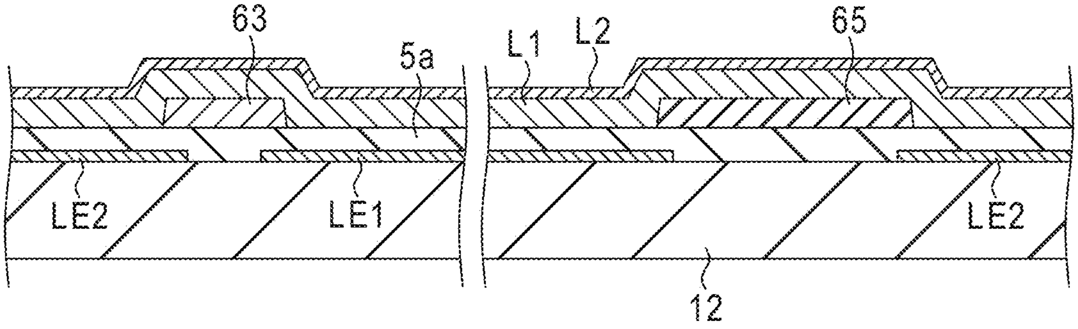
FIG. 7D is a schematic cross-sectional view showing a process following FIG. 7C.

After the formation of the insulating layer 65 and the first conductive layer 63, as shown in FIG. 7D, a first layer L1 which should be processed into the second conductive layer 64 and a second layer L2 which should be processed into the upper portion 62 are formed. The first layer L1 covers the first conductive layer 63, the insulating layer 65 and the rib layer 5*a* as a whole. The second layer L2 covers the first layer L1 as a whole.

Figure 7E:
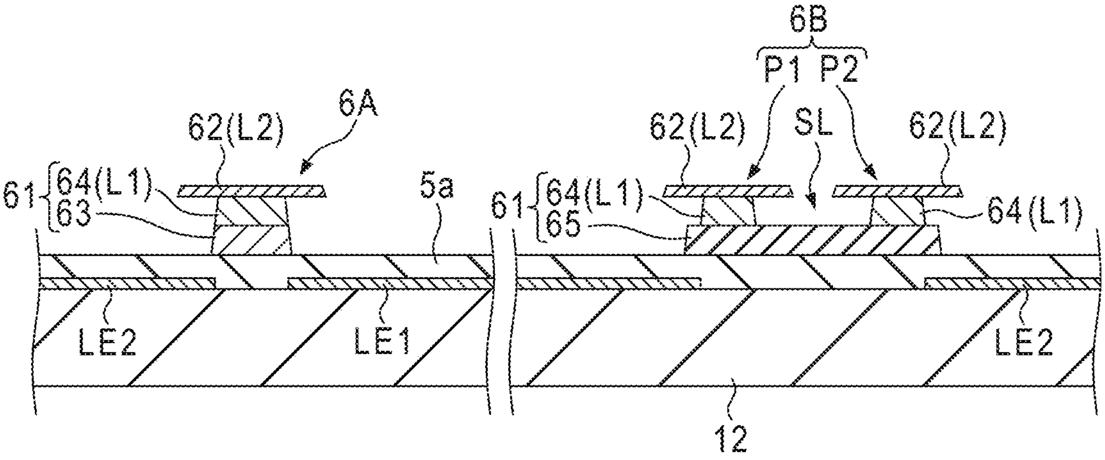
FIG. 7E is a schematic cross-sectional view showing a process following FIG. 7D.

Subsequently, as shown in FIG. 7E, the first layer L1 and the second layer L2 are patterned, and the second conductive layer 64 and the upper portion 62 are formed. At this time, the second conductive layer 64 and the upper portion 62 are divided above the insulating layer 65. The first portion P1, the second portion P2 and the slit SL between these portions are formed. By this process, the first partition 6A and the second partition 6B are completed.

The upper portion 62 is patterned by, for example, wet etching. The first layer L1 is patterned by, for example, dry etching and wet etching. Specifically, first, the portion of the first layer L1 exposed from the upper portion 62 is removed by dry etching. Subsequently, the width of the first layer L1 located under the upper portion 62 is reduced by wet etching. In these dry etching and wet etching, the first conductive layer 63 could be also eroded. Therefore, before the first layer L1 is patterned, the width of the first conductive layer 63 should be preferably greater than the width of the first conductive layer 63 required for the ultimate first partition 6A.

Figure 7F:
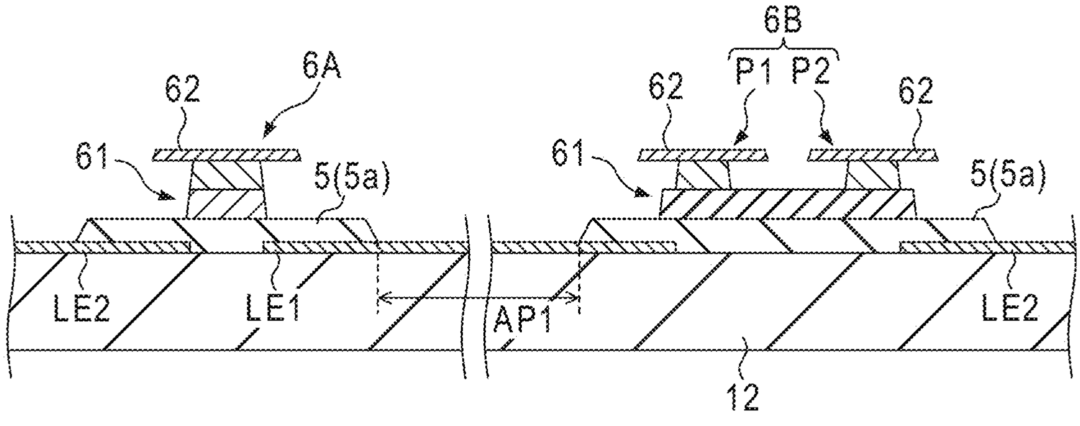
FIG. 7F is a schematic cross-sectional view showing a process following FIG. 7E.

After the formation of the first partition 6A and the second partition 6B, the rib layer 5*a* is patterned as shown in FIG. 7F, and the rib 5 having the pixel apertures AP1, AP2 and AP3 is formed.

Subsequently, a process for forming the display elements DE1, DE2 and DE3 is performed. The formation order of the display elements DE1, DE2 and DE3 is not particularly limited. For example, the display element DE1 is formed firstly, and the display element DE2 is formed secondly, and the display element DE3 is formed lastly.

Figure 7G:
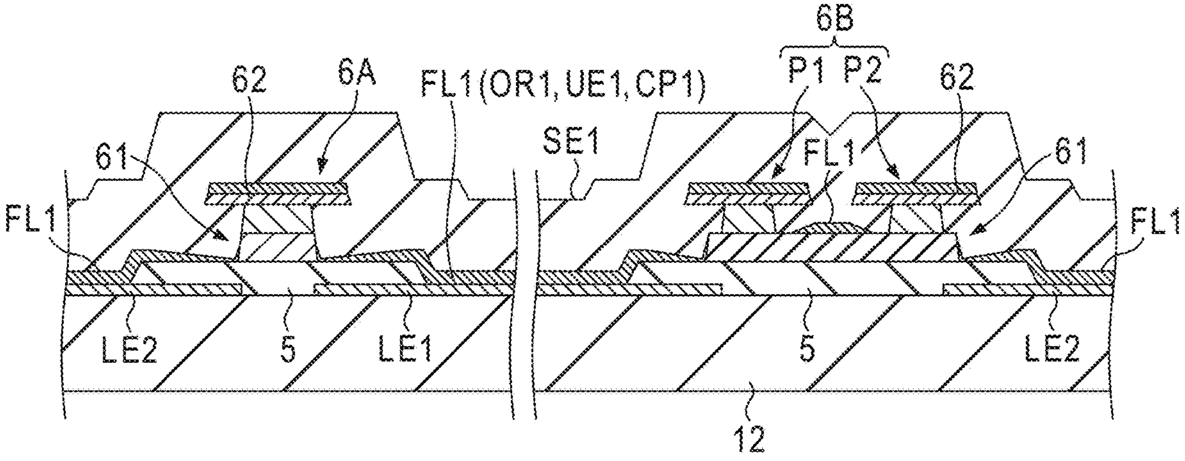
FIG. 7G is a schematic cross-sectional view showing a process following FIG. 7F.

To form the display element DE1, as shown in FIG. 7G, the stacked film FL1 and the sealing layer SE1 are formed in the entire substrate which is in the middle of the manufacturing process. Each of the organic layer OR1, upper electrode UE1 and cap layer CP1 constituting the stacked film FL1 is formed by vapor deposition. The sealing layer SE1 is formed by chemical vapor deposition (CVD).

The stacked film FL1 is divided by the first partition 6A having an overhang shape, and the first and second portions P1 and P2 of the second partition 6B having an overhang shape. The sealing layer SE1 continuously covers the stacked film FL1, the first partition 6A, the first portion P1 and the second portion P2 without being divided. The stacked film FL1 and the sealing layer SE1 are also formed in the space between the first portion P1 and the second portion P2.

Figure 7H:
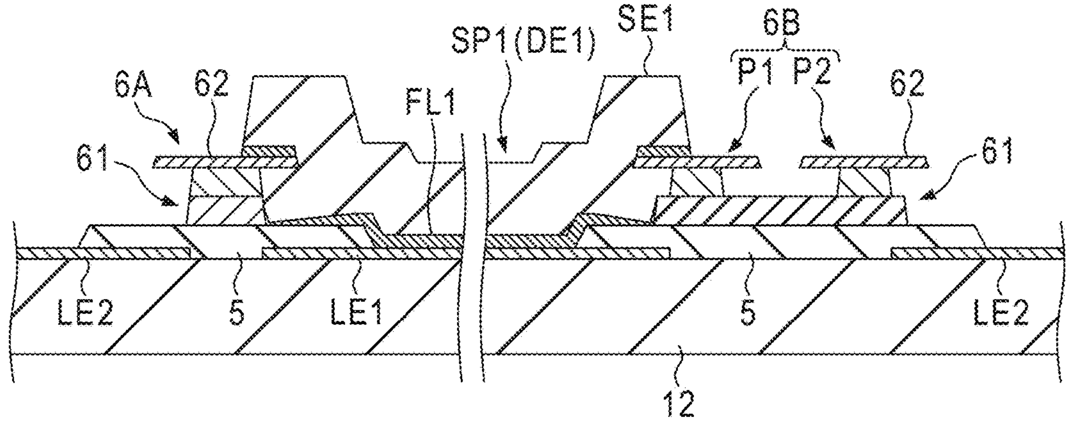
FIG. 7H is a schematic cross-sectional view showing a process following FIG. 7G.

Subsequently, the stacked film FL1 and the sealing layer SE1 are patterned as shown in FIG. 7H. In this patterning, of the stacked film FL1 and the sealing layer SE1, the portions located in subpixel SP1 remain, and the other portions are removed. By this process, a substrate in which the display element DE1 is formed in subpixel SP1 can be obtained. In this patterning, the stacked film FL1 and the sealing layer SE1 formed in the space between the first portion P1 and the second portion P2 are also eliminated.

The display elements DE2 and DE3 are formed by processes similar to the process of the display element DE1. After the formation of the display elements DE1, DE2 and DE3, the resin layer 13 and the sealing layer 14 are formed. Further, the cover member 16 is attached via the adhesive layer 15, and thus, the display device DSP is completed.

Figure 8:
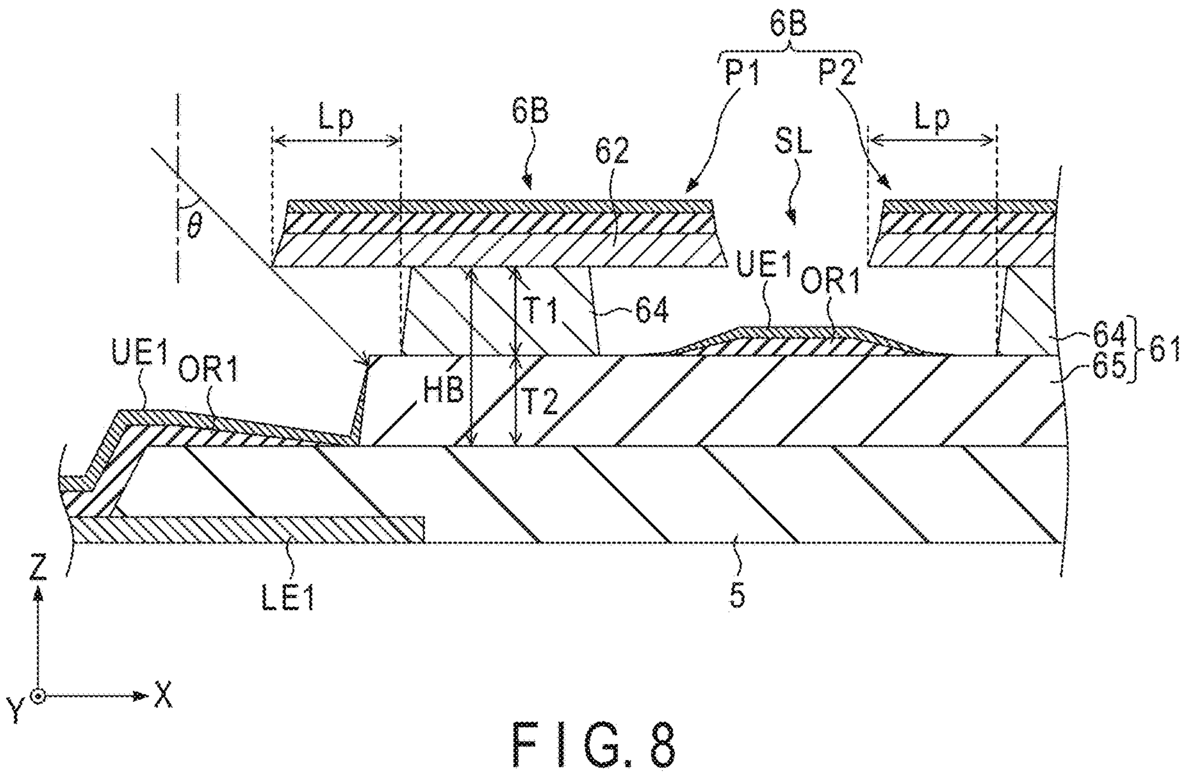
FIG. 8 is a schematic cross-sectional view showing the process of forming an upper electrode.

FIG. 8 is a schematic cross-sectional view showing the process of forming the upper electrode UE1. When the upper electrode UE1 is formed, the evaporation material of the upper electrode UE1 is emitted from an evaporation source at a spread angle θ relative to a third direction Z. The spread angle θ is, for example, up to approximately 45 degrees. The shape of the second partition 6B is determined such that the evaporation material is not attached to the second conductive layer 64.

Specifically, to prevent the attachment of the evaporation material to the second conductive layer 64, the relationship between the protrusion length Lp of the upper portion 62 in each of the first portion P1 and the second portion P2 and thickness T1 of the second conductive layer 64 must be appropriately determined. The protrusion length Lp corresponds to the distance from the side surface of the second conductive layer 64 to the end portion of the upper portion 62. For example, assuming that the spread angle θ is 45 degrees, thickness T1 needs to be less than or equal to the protrusion length Lp to prevent the attachment of the evaporation material to the second conductive layer 64.

For example, when the protrusion length Lp is 0.5 μm, thickness T1 should be preferably less than or equal to 0.5 μm. Thickness T2 of the insulating layer 65 is, for example, equal to thickness T1, that is, 0.5 μm. In this case, height HB is 1.0 μm.

In the structure in which the both end portions of the insulating layer 65 protrude from the side surfaces of the second conductive layer 64 as in the case of the example of FIG. 8, if thickness T1 of the second conductive layer 64 is too less, the formation of the sealing layer SE1 which satisfactorily covers the side surfaces of the second conductive layer 64 may be difficult in some cases. Therefore, a thickness which is greater than or equal to 0.2 μm should be preferably assured for thickness T1.

In FIG. 8, the upper electrode UE1 is particularly looked at. However, the upper electrodes UE2 and UE3 are formed by vapor deposition similar to that of the upper electrode UE1. The attachment of the upper electrodes UE2 and UE3 to the second conductive layer 64 can be prevented by determining thickness T1 so as to be less than or equal to the protrusion length Lp. Further, when thickness T1 is, for example, greater than or equal to 0.2 μm, the sealing layers SE2 and SE3 can be formed so as to satisfactorily cover the side surfaces of the second conductive layer 64.

Figure 9:
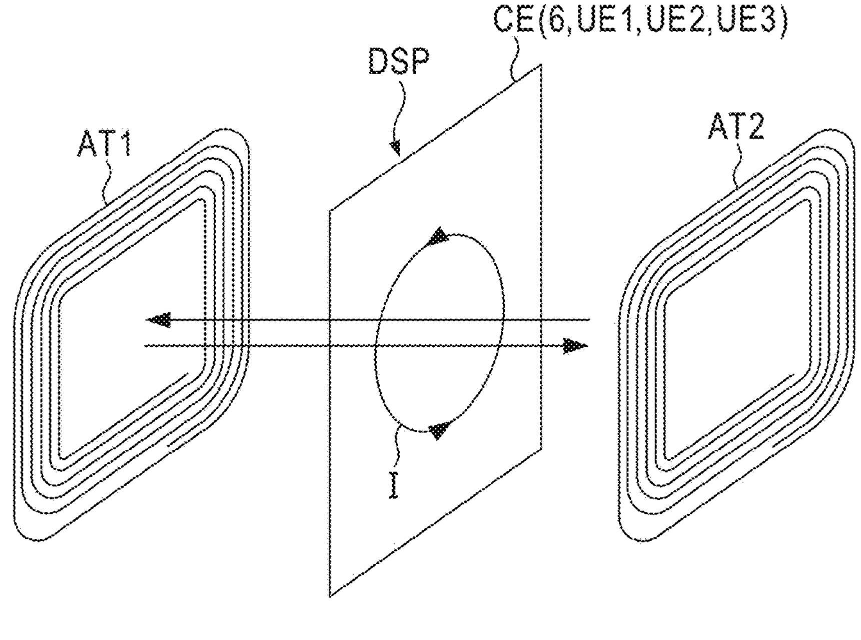
FIG. 9 is a diagram for explaining the effect of the display device according to the first embodiment.
Figure 10:
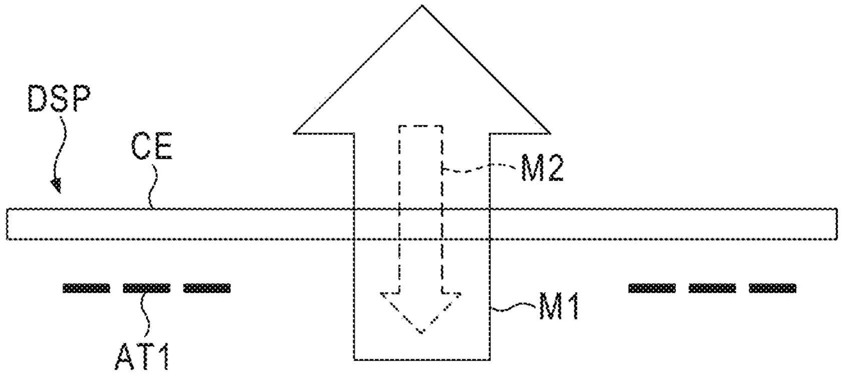
FIG. 10 is a diagram for explaining the effect of the display device according to the first embodiment.

FIG. 9 and FIG. 10 are diagrams for explaining the effects of the display device DSP according to the embodiment. An electronic device on which the display device DSP is mounted may comprise an antenna AT1 for near field communication (NFC). The antenna AT1 is provided so as to, for example, face the rear side of the display device DSP (in other words, the lower surface of the substrate 10 shown in FIG. 4) and wirelessly communicates with the antenna AT2 of another electronic device through the display device DSP.

The partition 6 and the upper electrodes UE1, UE2 and UE3 provided in the display area DA constitute a common electrode CE to which common voltage is applied. At the time of wireless communication between the antennas AT1 and AT2, eddy current I is generated in the common electrode CE by magnetic field M1 formed by the antenna AT1. By eddy current I, magnetic field M2 having a direction which negates magnetic field M1 is formed, and the signal strength is attenuated. Thus, when wireless communication is performed via the display device DSP, the communication sensitivity could be decreased. In particular, when the partition 6 mainly formed of a metal material and having a grating shape is formed in the entire display area DA, the resistance of the common electrode CE is low. Thus, a large eddy current I occurs, thereby generating a strong magnetic field M2. Thus, the communication sensitivity is easily decreased.

In the embodiment, the partition 6 has the first partition 6A and the second partition 6B. Electricity is supplied to the upper electrodes UE1, UE2 and UE3 by the first partition 6A in which the lower portion 61 is formed of a conductive layer as a whole. To the contrary, the second partition 6B is not directly electrically connected to the upper electrode UE1, UE2 or UE3. The resistance of the common electrode CE is defined by the resistances of the upper portion 62 of the partition 6 provided in substantially a net-like shape between subpixels SP1 and SP2, between subpixels SP1 and SP3 and between subpixels SP2 and SP3, the first partition 6A and the second partition 6B, and the connection state between the upper electrodes UE1, UE2 and UE3 and the partition 6. Among them, the resistance of the second partition 6B portion is, for example, approximately half the resistance of the first partition 6A portion. Thus, by providing such a second partition 6B in the display area DA, the resistance of the common electrode CE is increased. As a result, the eddy current of the common electrode CE is suppressed, and thus, the reduction in communication sensitivity can be lessened.

Further, in the embodiment, each second partition 6B is divided into the first portion P1 and the second portion P2 by the slit SL. By this configuration, the resistance of the common electrode CE, especially the resistance in a direction crossing the slit SL, is further increased, and thus, the effect of preventing the reduction in communication sensitivity is enhanced.

The second partition 6B exerts the function of dividing the stacked films FL1, FL2 and FL3 in the same manner as the first partition 6A. Thus, even if the second partition 6B is provided, the stacked films FL1, FL2 and FL3 can be divided around subpixels SP1, SP2 and SP3 and can be satisfactorily sealed with the sealing layers SE1, SE2 and SE3.

To more assuredly prevent the conduction between the first portion P1 and the second portion P2, the upper electrode UE1 (see FIG. 8) which is formed in the space between the first portion P1 and the second portion P2 at the time of forming the display element DE1 should be preferably eliminated in the etching of the subsequent patterning process. In the embodiment, as the insulating layer 65 is not divided by the slit SL, the space is formed so as to be shallow. Thus, the removal of the upper electrode UE1 in the space is easy. Even in a case where the upper electrode UE1 is not completely removed, the conduction between the first portion P1 and the second portion P2 is prevented as the upper electrode UE1 is not in contact with the second conductive layer 64 of the first portion P1 or the second portion P2. Similar effects can be obtained regarding the upper electrodes UE2 and UE3.

The configuration disclosed in the embodiment could be modified in various ways.

Figure 11:
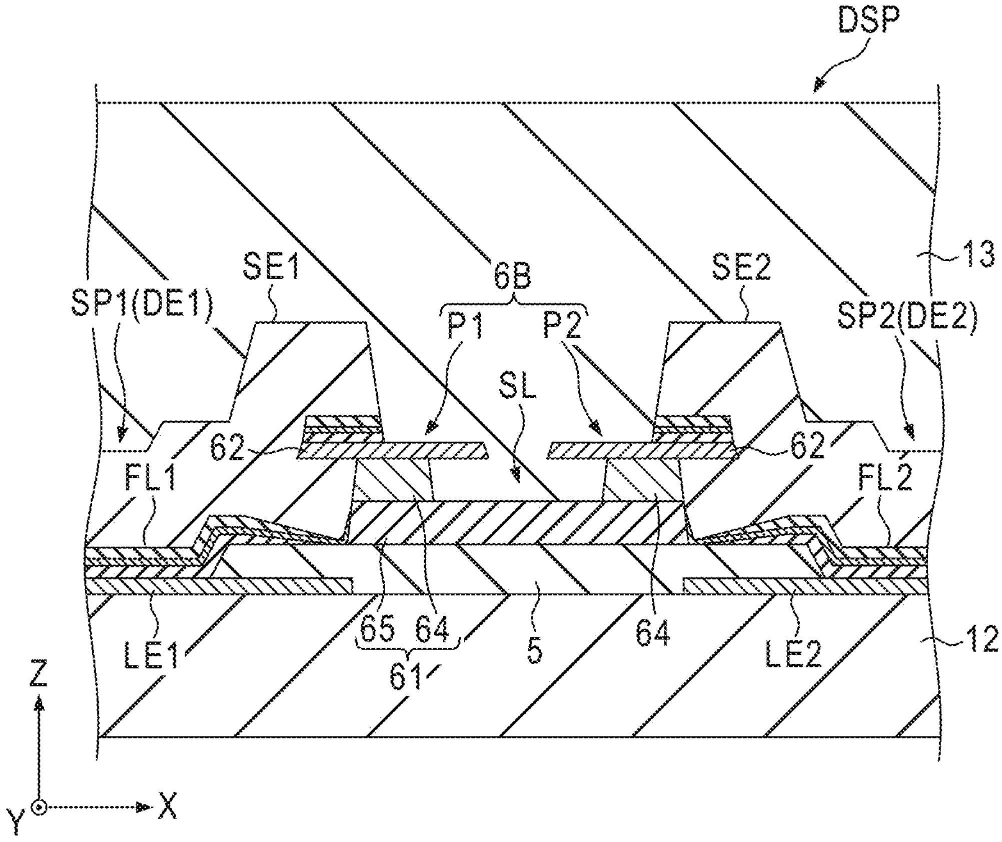
FIG. 11 is a schematic cross-sectional view showing another example of a second partition according to the first embodiment.

FIG. 11 is a schematic cross-sectional view showing another example of the second partition 6B according to the embodiment. In the example of this figure, each end portion of the insulating layer 65 does not protrude from the side surface of the second conductive layer 64 of the first portion P1 or the second portion P2. By this configuration, each side surface of the insulating layer 65 is aligned with a corresponding side surface of the second conductive layer 64. The effects described above can be obtained from even this configuration.

Figure 12A:
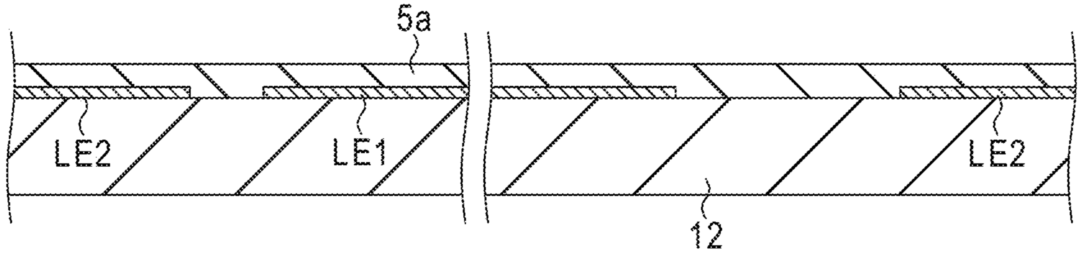
FIG. 12A is a schematic cross-sectional view showing another example of the manufacturing process of the display device according to the first embodiment.

FIG. 12A to FIG. 12E are schematic cross-sectional views showing another example of the manufacturing method of the display device DSP according to the embodiment. In FIG. 12A, a rib layer 5*a* which covers the lower electrodes LE1, LE2 and LE3 as a whole is formed in the same manner as FIG. 7A.

Figure 12B:
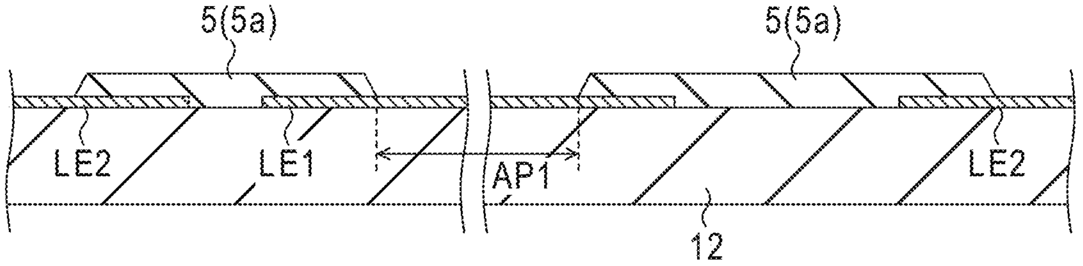
FIG. 12B is a schematic cross-sectional view showing a process following FIG. 12A.

Subsequently, the rib layer 5*a* is patterned as shown in FIG. 12B, and the rib 5 having the pixel apertures AP1, AP2 and AP3 is formed. Thus, the rib 5 is formed before the formation of the partition 6 in the example of FIG. 12A to FIG. 12E.

Figure 12C:
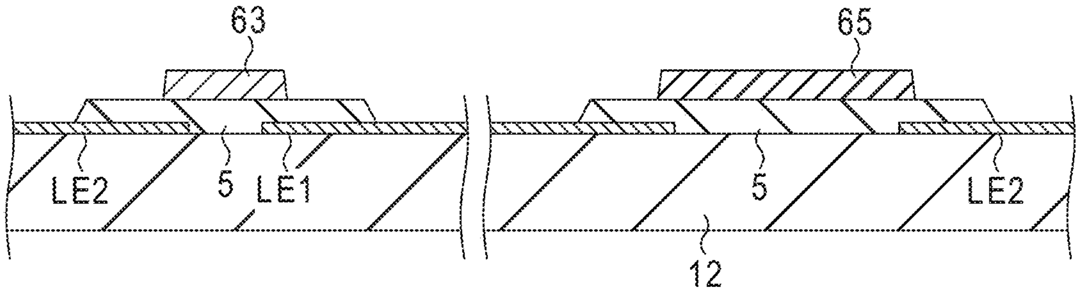
FIG. 12C is a schematic cross-sectional view showing a process following FIG. 12B.
Figure 12D:
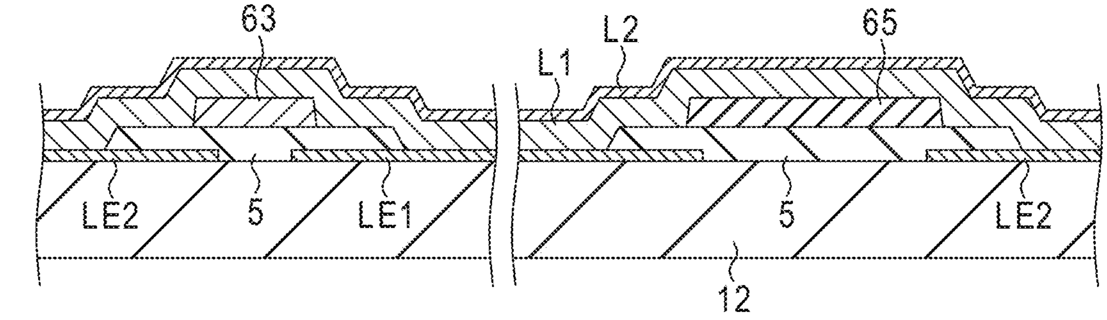
FIG. 12D is a schematic cross-sectional view showing a process following FIG. 12C.

After the formation of the rib 5, as shown in FIG. 12C, the insulating layer 65 is formed at a position where the second partition 6B should be formed, and the first conductive layer 63 is formed at a position where the first partition 6A should be formed. Further, as shown in FIG. 12D, a first layer L1 which should be processed into the second conductive layer 64 and a second layer L2 which should be processed into the upper portion 62 are formed.

Figure 12E:
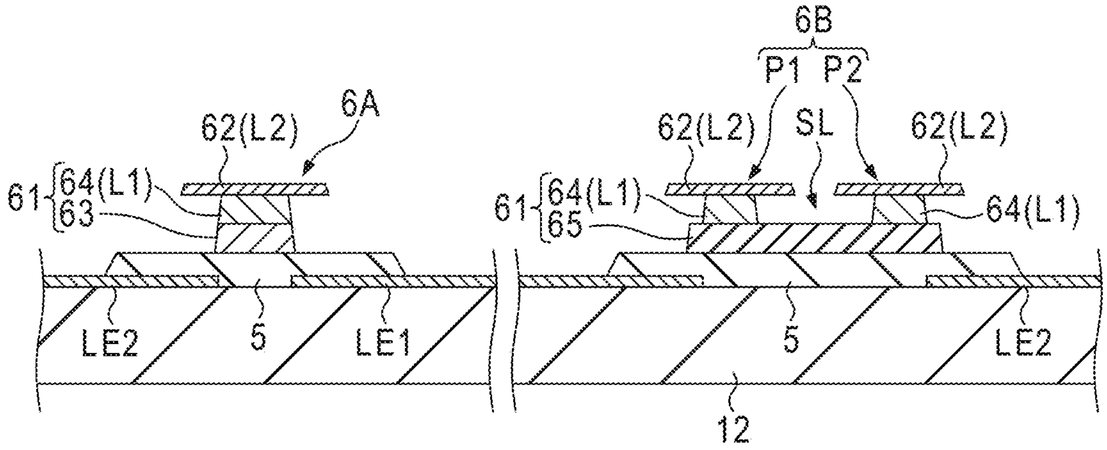
FIG. 12E is a schematic cross-sectional view showing a process following FIG. 12D.

Subsequently, as shown in FIG. 12E, the first layer L1 and the second layer L2 are patterned, and the second conductive layer 64 and the upper portion 62 are formed. By this process, the first partition 6A and the second partition 6B are completed. The subsequent process is similar to that of the above description of this embodiment.

Second Embodiment

A second embodiment is explained. The configurations or effects which are not particularly referred to are the same as those of the first embodiment.

Figure 13:
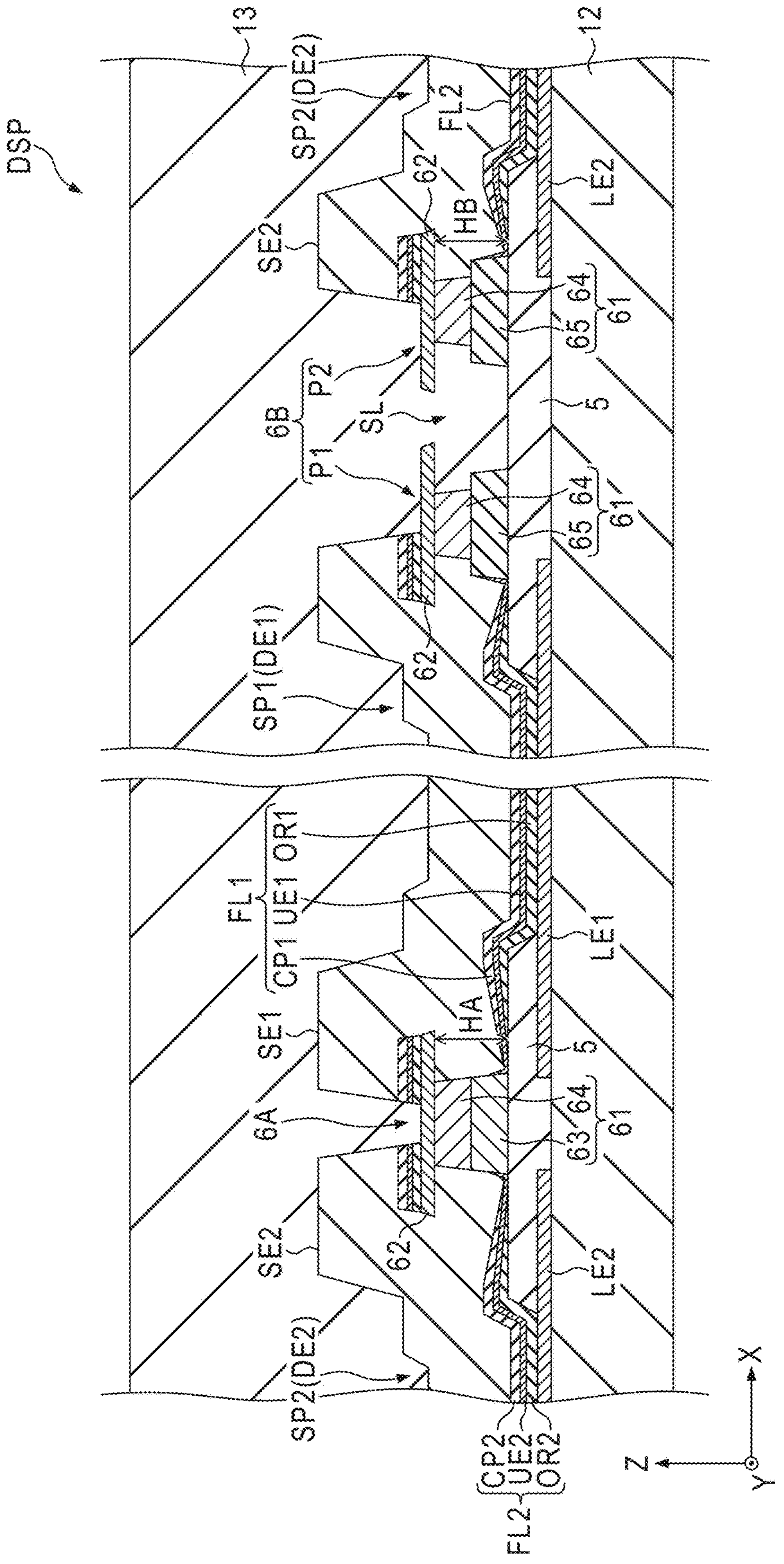
FIG. 13 is a schematic cross-sectional view of a display device according to a second embodiment.

FIG. 13 is a schematic cross-sectional view of a display device DSP according to the second embodiment, and shows a structure along the V-V line of FIG. 3 in the same manner as FIG. 5. In this embodiment, the insulating layer 65 of a second partition 6B is divided in a slit SL. By this configuration, the lower portions 61 of a first portion P1 and a second portion P2 are spaced apart from each other as a whole.

In a manner similar to that of the first embodiment, in the space between the first portion P1 and the second portion P2, none of stacked films FL1, FL2 and FL3 and sealing layers SE1, SE2 and SE3 is provided. For example, this space is filled with a resin layer 13.

FIG. 14A to FIG. 14F are schematic cross-sectional views showing a process for forming a rib 5 and a partition 6 in the display device DSP according to the second embodiment. In these figures, the illustrations of a substrate 10 and a circuit layer 11 are omitted.

Figure 14A:
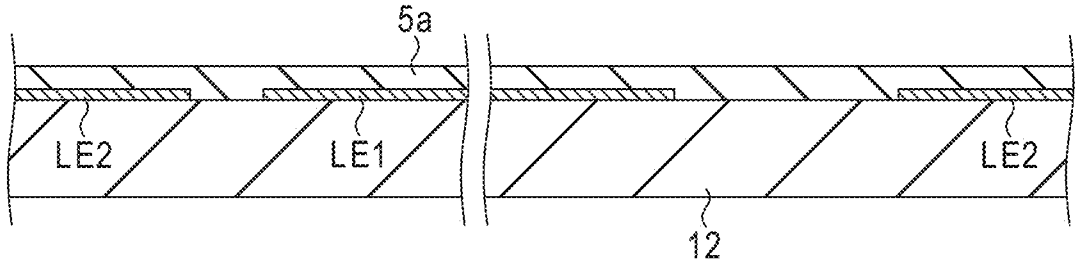
FIG. 14A is a schematic cross-sectional view showing part of the manufacturing process of the display device according to the second embodiment.

In FIG. 14A, a rib layer 5*a* which covers lower electrodes LE1, LE2 and LE3 as a whole is formed in the same manner as FIG. 7A.

Figure 14B:
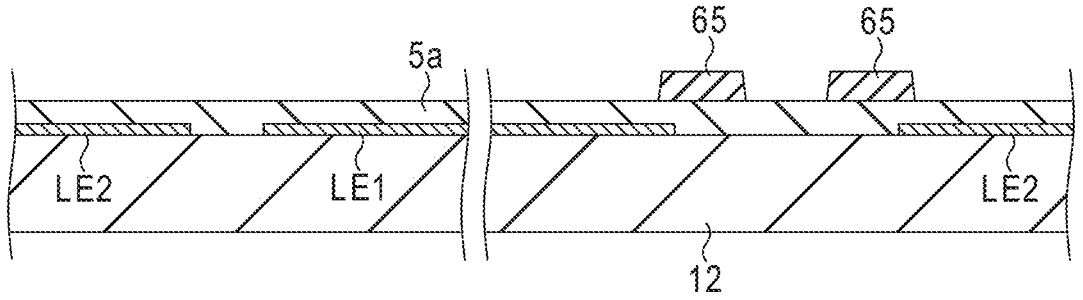
FIG. 14B is a schematic cross-sectional view showing a process following FIG. 14A.
Figure 14C:
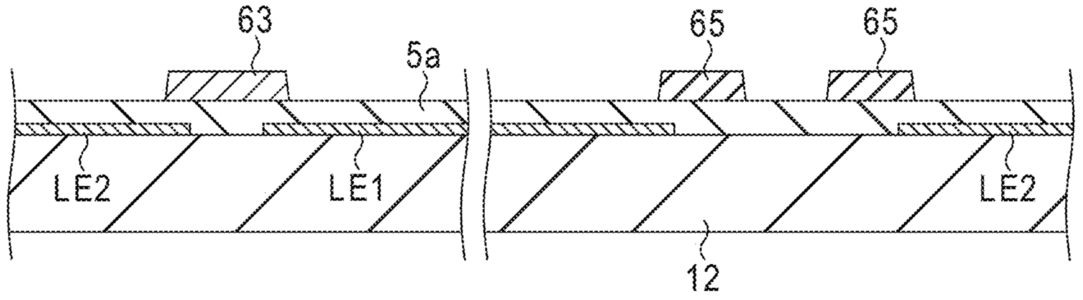
FIG. 14C is a schematic cross-sectional view showing a process following FIG. 14B.

After the formation of the rib layer 5*a*, as shown in FIG. 14B, an insulating layer 65 is formed at each of positions where the first and second portions P1 and P2 of the second partition 6B should be formed. Further, as shown in FIG. 14C, a first conductive layer 63 is formed at a position where a first partition 6A should be formed.

Figure 14D:
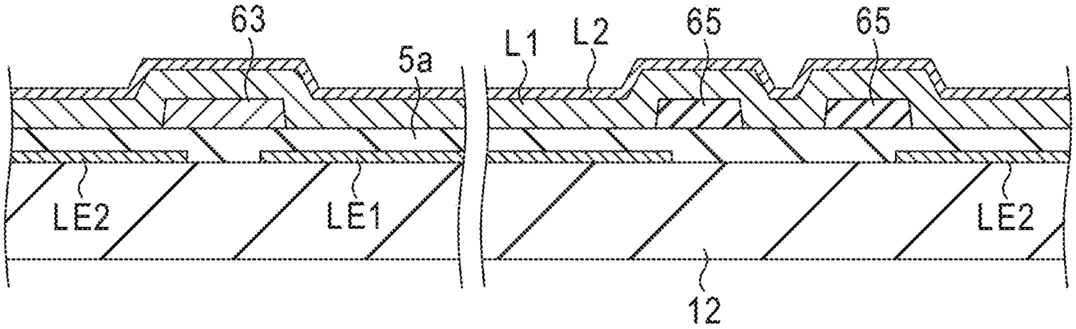
FIG. 14D is a schematic cross-sectional view showing a process following FIG. 14C.
Figure 14E:
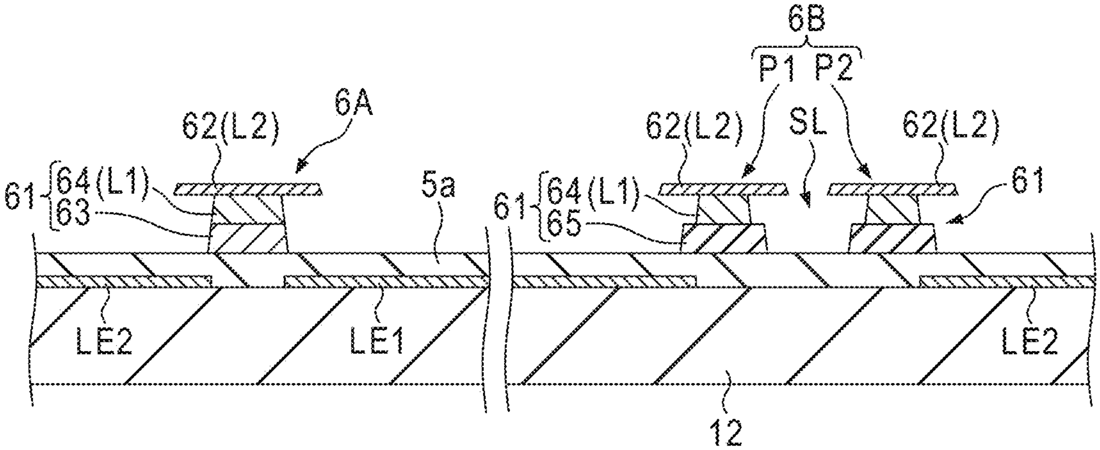
FIG. 14E is a schematic cross-sectional view showing a process following FIG. 14D.

Subsequently, as shown in FIG. 14D, a first layer L1 which should be processed into a second conductive layer 64 and a second layer L2 which should be processed into an upper portion 62 are formed. Subsequently, as shown in FIG. 14E, the first layer L1 and the second layer L2 are patterned, and the second conductive layer 64 and the upper portion 62 are formed. By this process, the first partition 6A and the second partition 6B are completed.

Figure 14F:
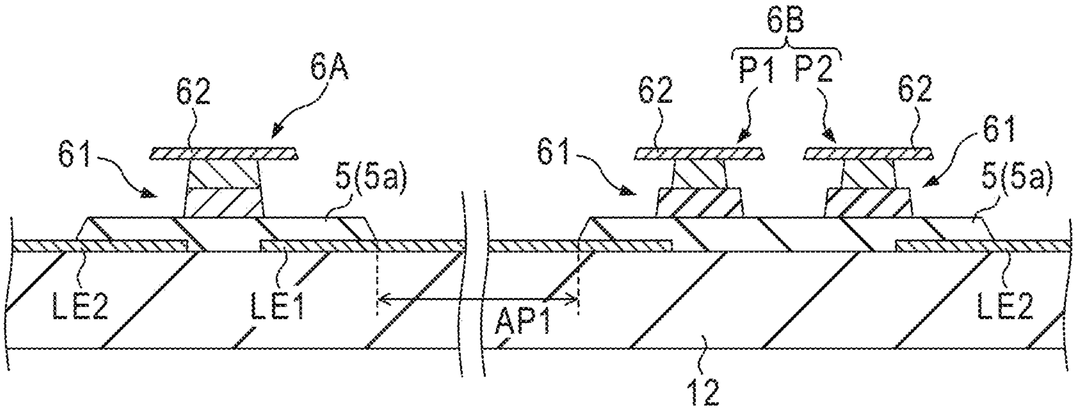
FIG. 14F is a schematic cross-sectional view showing a process following FIG. 14E.

After the formation of the first partition 6A and the second partition 6B, the rib layer 5*a* is patterned as shown in FIG. 14F, and the rib 5 having pixel apertures AP1, AP2 and AP3 is formed. The subsequent process is similar to that of the above description of the first embodiment.

FIG. 14A to FIG. 14F show the example in which the pixel apertures AP1, AP2 and AP3 are formed after the formation of the partition 6. As another example, the partition 6 may be formed after the formation of the pixel apertures AP1, AP2 and AP3.

Figure 15:
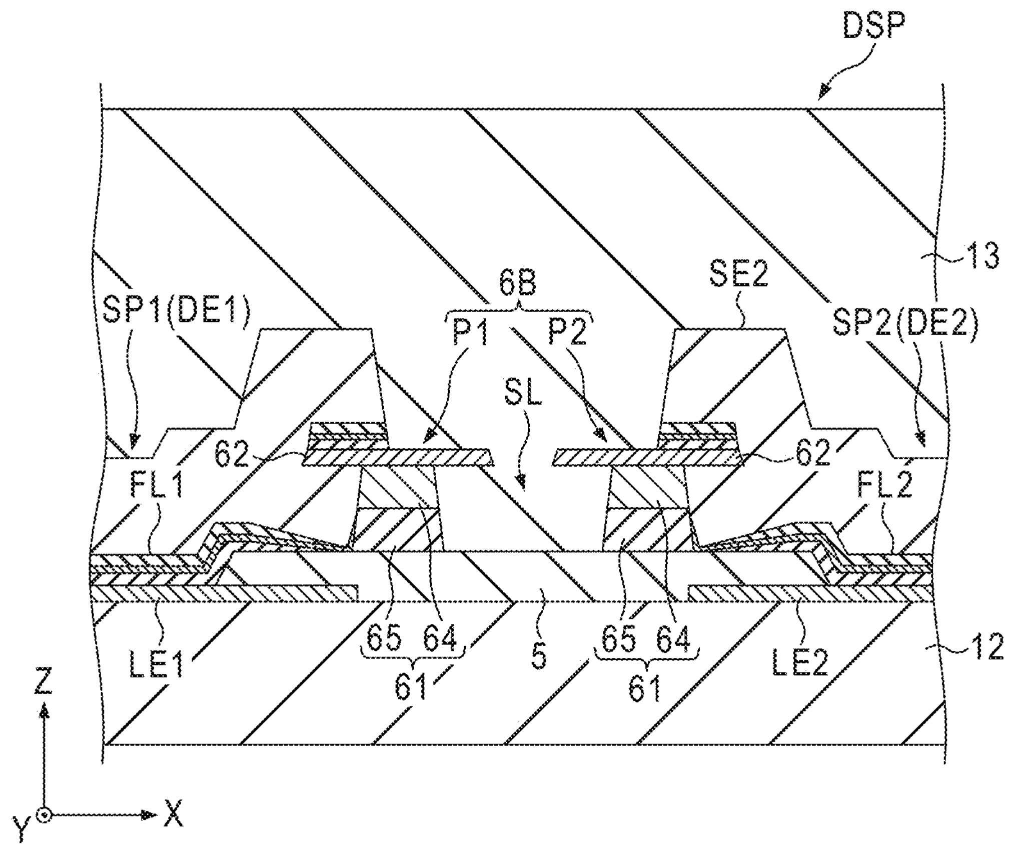
FIG. 15 is a schematic cross-sectional view showing another example of a second partition according to the second embodiment.

FIG. 15 is a schematic cross-sectional view showing another example of the second partition 6B according to the embodiment. In the example of this figure, the both end portions of the insulating layer 65 do not protrude from the side surfaces of the second conductive layer 64 in each of the first portion P1 and the second portion P2. By this configuration, each side surface of the insulating layer 65 is aligned with a corresponding side surface of the second conductive layer 64.

Even in the configuration of the embodiment described above, effects similar to those of the first embodiment can be obtained.

Third Embodiment

A third embodiment is explained. The configurations or effects which are not particularly referred to are the same as those of the first embodiment.

Figure 16:
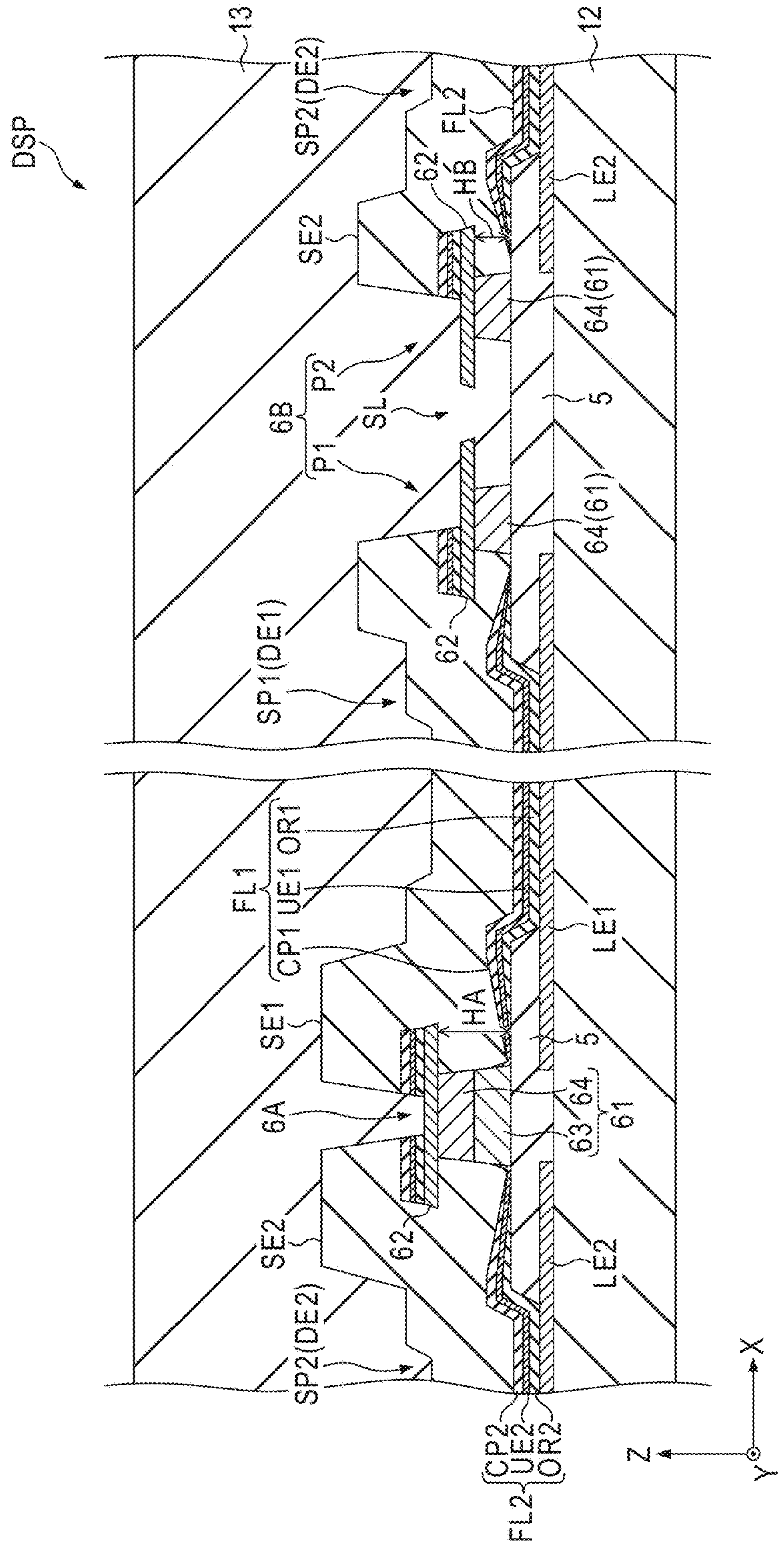
FIG. 16 is a schematic cross-sectional view of a display device according to a third embodiment.

FIG. 16 is a schematic cross-sectional view of a display device DSP according to the third embodiment, and shows a structure along the V-V line of FIG. 3 in the same manner as FIG. 5. In this embodiment, the lower portion 61 of a second partition 6B consists of a second conductive layer 64 and has neither a first conductive layer 63 nor an insulating layer 65. However, a first partition 6A has the first conductive layer 63 and the second conductive layer 64 in the same manner as the first embodiment. By this configuration, height HB of the second partition 6B is less than height HA of the first partition 6A.

Neither an upper electrode UE1 nor an upper electrode UE2 is in contact with the lower portion 61 (the second conductive layer 64) of the first portion P1 or the second portion P2 of the second partition 6B above a rib 5 located on the right side of the figure. Although not shown in the section of FIG. 16, similarly, an upper electrode UE3 is not in contact with the side surface of the lower portion 61 of the second partition 6B facing subpixel SP3.

Figure 17:
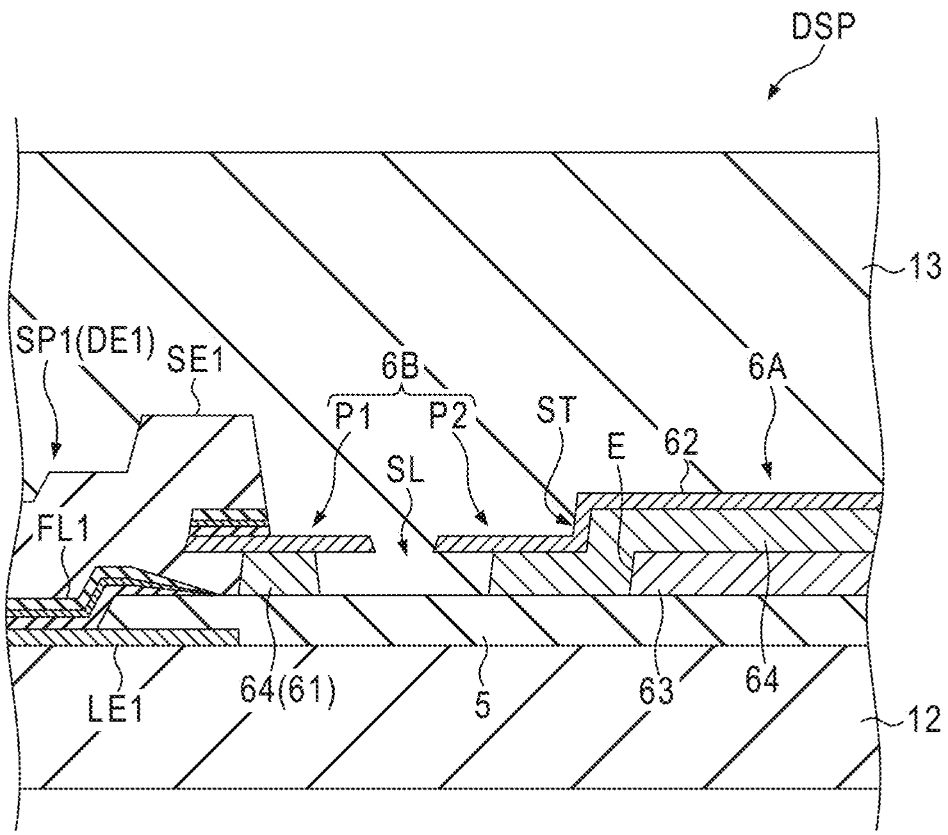
FIG. 17 is another schematic cross-sectional view of the display device according to the third embodiment.

FIG. 17 is another schematic cross-sectional view of the display device DSP according to the third embodiment, and shows a structure along the VI-VI line of FIG. 3 in the same manner as FIG. 6. The second conductive layer 64 of the first partition 6A and the second conductive layer 64 of the second partition 6B (in FIG. 17, the second conductive layer 64 of the second portion P2) are continuous with each other. The upper portion 62 of the first partition 6A and the upper portion 62 of the second partition 6B (in FIG. 17, the upper portion 62 of the second portion P2) are also continuous with each other.

In the example of FIG. 17, a step ST is formed on the surface of the upper portion 62 in the boundary between the first partition 6A and the second partition 6B (the second portion P2) because of an end portion E of the first conductive layer 63.

FIG. 18A to FIG. 18E are schematic cross-sectional views showing a process for forming the rib 5 and a partition 6 in the display device DSP according to the third embodiment. In these figures, the illustrations of a substrate 10 and a circuit layer 11 are omitted.

Figure 18A:
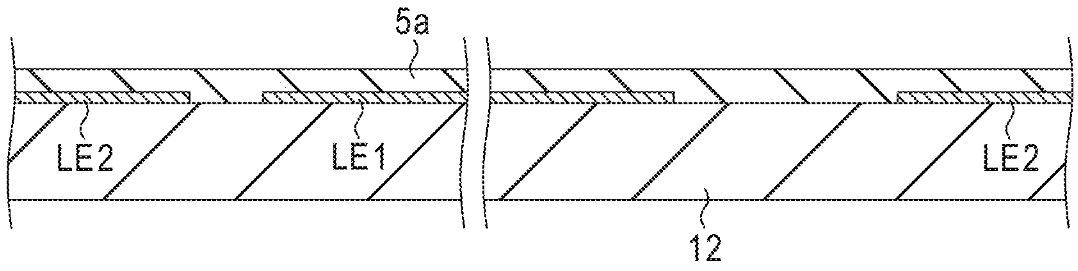
FIG. 18A is a schematic cross-sectional view showing part of the manufacturing process of the display device according to the third embodiment.

In FIG. 18A, a rib layer 5*a* which covers lower electrodes LE1, LE2 and LE3 as a whole is formed in the same manner as FIG. 7A.

Figure 18B:
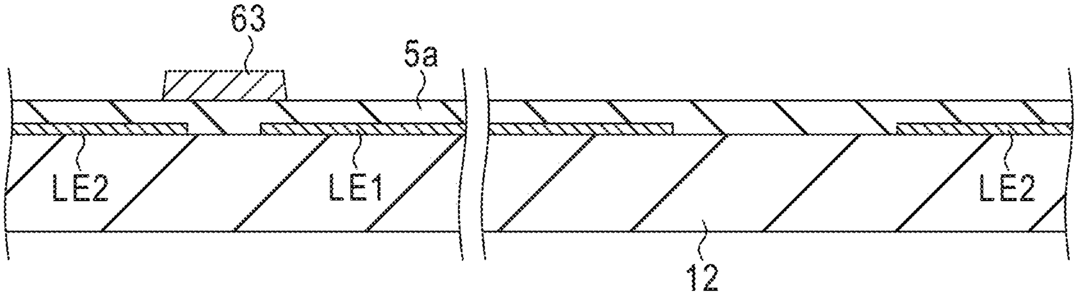
FIG. 18B is a schematic cross-sectional view showing a process following FIG. 18A.
Figure 18C:
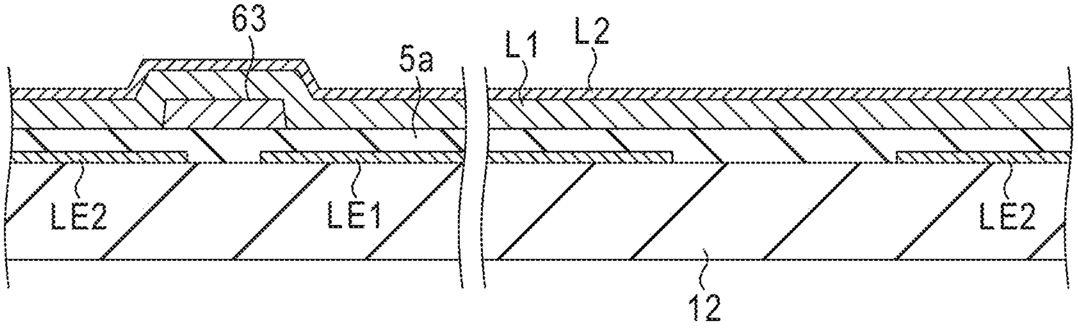
FIG. 18C is a schematic cross-sectional view showing a process following FIG. 18B.

After the formation of the rib layer 5*a*, as shown in FIG. 18B, the first conductive layer 63 is formed at a position where the first partition 6A should be formed. Further, as shown in FIG. 18C, a first layer L1 which should be processed into the second conductive layer 64 and a second layer L2 which should be processed into the upper portion 62 are formed. The first layer L1 covers the first conductive layer 63 and the rib layer 5*a* as a whole. The second layer L2 covers the first layer L1 as a whole.

Figure 18D:
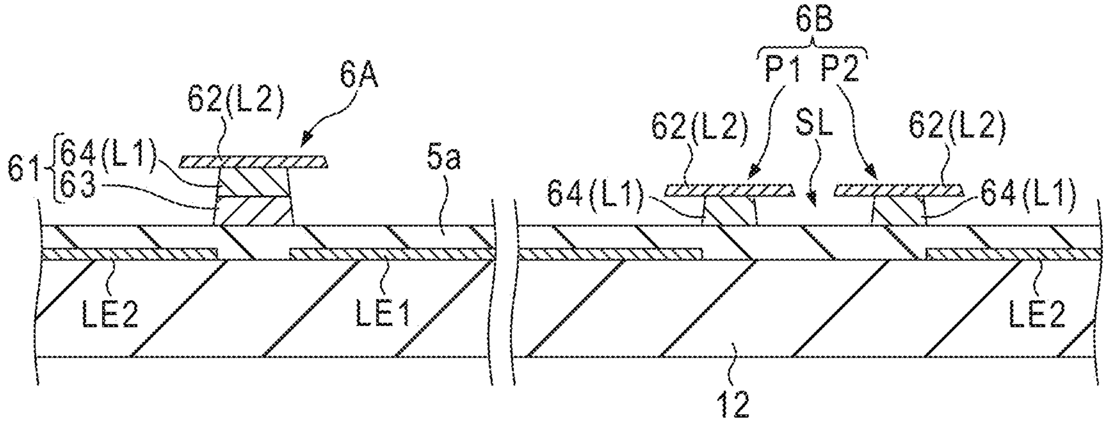
FIG. 18D is a schematic cross-sectional view showing a process following FIG. 18C.

Subsequently, as shown in FIG. 18D, the first layer L1 and the second layer L2 are patterned, and the second conductive layer 64 and the upper portion 62 are formed. By this process, the first partition 6A and the second partition 6B are completed.

Figure 18E:
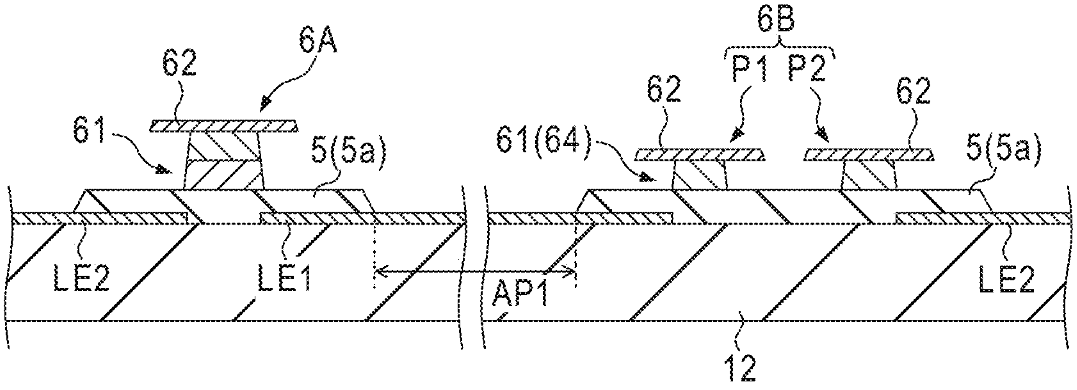
FIG. 18E is a schematic cross-sectional view showing a process following FIG. 18D.

After the formation of the first partition 6A and the second partition 6B, the rib layer 5*a* is patterned as shown in FIG. 18E, and the rib 5 having pixel apertures AP1, AP2 and AP3 is formed. The subsequent process is similar to that of the above description of the first embodiment.

FIG. 18A to FIG. 18E show the example in which the pixel apertures AP1, AP2 and AP3 are formed after the formation of the partition 6. As another example, the partition 6 may be formed after the formation of the pixel apertures AP1, AP2 and AP3.

Figure 19:
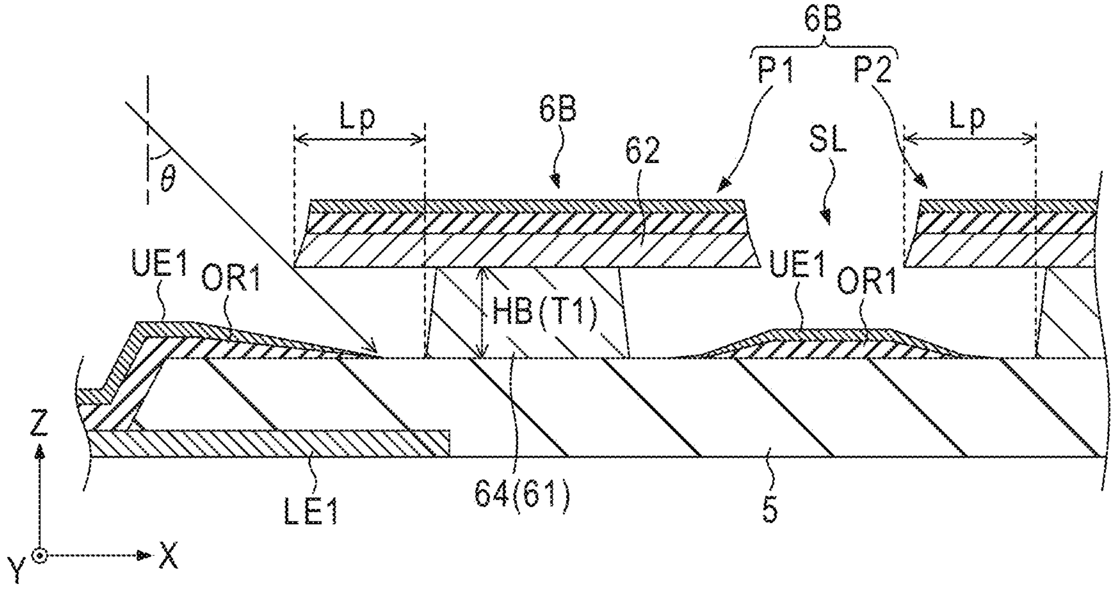
FIG. 19 is a schematic cross-sectional view showing the process of forming an upper electrode in the third embodiment.

FIG. 19 is a schematic cross-sectional view showing the process of forming an upper electrode UE1. As described above, when the upper electrode UE1 is formed, the evaporation material of the upper electrode UE1 is emitted from an evaporation source at a spread angle θ relative to a third direction Z. The protrusion length Lp of the upper portion 62 and height HB of the second partition 6B (thickness T1 of the second conductive layer 64) are determined such that the evaporation material is not attached to the second conductive layer 64.

For example, assuming that the spread angle θ is 45 degrees, height HB (thickness T1) needs to be less than or equal to the protrusion length Lp to prevent the attachment of the evaporation material to the second conductive layer 64. For example, when the protrusion length Lp is 0.5 μm, height HB should be preferably less than or equal to 0.5 μm.

Further, if height HB is too less, the formation of a sealing layer SE1 which satisfactorily covers the side surfaces of the second conductive layer 64 may be difficult in some cases. Moreover, if height HB is too less, there is a possibility that a stacked film FL1 is not divided by the second partition 6B. To solve this problem, a height greater than or equal to 0.2 μm should be preferably assured for height HB.

In FIG. 19, the upper electrode UE1 is particularly looked at. However, by determining height HB so as to be less than or equal to the protrusion length Lp, the attachment of upper electrodes UE2 and UE3 to the second conductive layer 64 can be prevented. Further, when height HB is, for example, greater than or equal to 0.2 μm, stacked films FL2 and FL3 can be divided by the second partition 6B, and sealing layers SE2 and SE3 can be formed so as to satisfactorily cover the side surfaces of the second conductive layer 64.

In this embodiment, as the second partition 6B is low, the space between the first portion P1 and the second portion P2 is shallow. Therefore, in a manner similar to that of the first embodiment, the removal of the upper electrode UE1 formed in the space is easy. Even in a case where the upper electrode UE1 is not completely removed, the conduction between the first portion P1 and the second portion P2 is prevented as the upper electrode UE1 is not in contact with the second conductive layer 64 of the first portion P1 or the second portion P2. Similar effects can be obtained regarding the upper electrodes UE2 and UE3.

In this embodiment, similarly, the second partition 6B is not directly electrically connected to the upper electrode UE1, UE2 or UE3. By providing such a second partition 6B in a display area DA, the resistance of a common electrode CE is increased in the same manner as the first embodiment. Thus, the reduction in the communication sensitivity of near field communication can be prevented.

MODIFIED EXAMPLES

This specification shows several modified examples related to the planar shapes of the first partition 6A and the second partition 6B in the following descriptions. The configurations disclosed in the first to third embodiments can be applied to the second partition 6B in each modified example. Further, the planar shape of the first partition 6A and the planar shape of the second partition 6B in each modified example can be replaced by each other.

Figure 20:
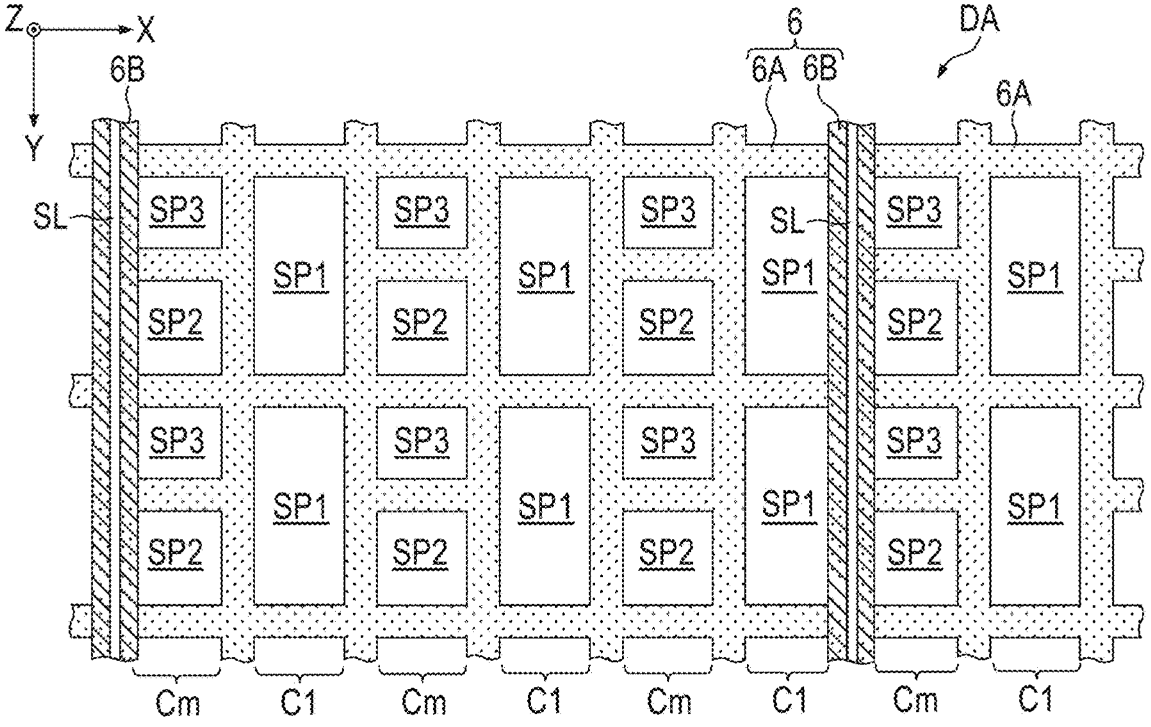
FIG. 20 is a schematic plan view of the first partition and the second partition according to a first modified example.

FIG. 20 is a schematic plan view of the first partition 6A and the second partition 6B according to a first modified example. In the first modified example, the number of second partitions 6B is reduced compared to the example of FIG. 2. In this configuration, several subpixels SP1, SP2 and SP3 do not face any second partition 6B in the display area DA.

Figure 21:
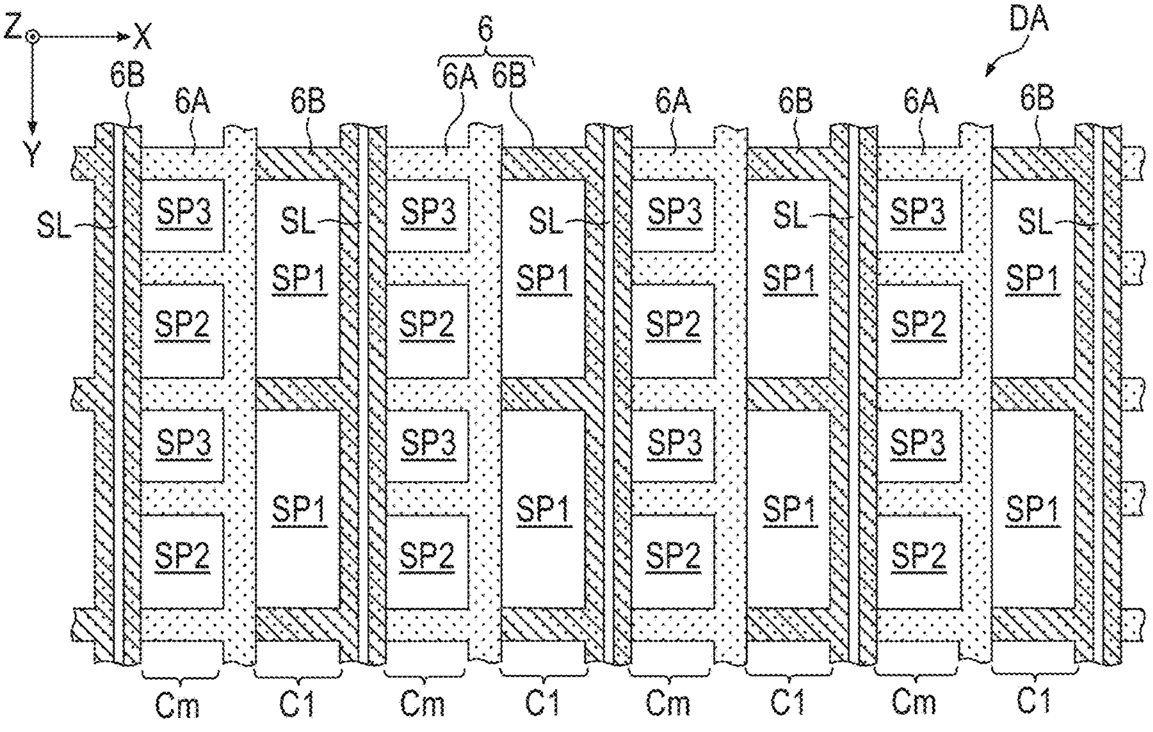
FIG. 21 is a schematic plan view of the first partition and the second partition according to a second modified example.

FIG. 21 is a schematic plan view of the first partition 6A and the second partition 6B according to a second modified example. In the second modified example, the second partition 6B is provided further between subpixels SP1 which are adjacent to each other in the second direction Y. By this configuration, three sides of each subpixel SP1 face the second partition 6B.

No slit SL is provided in the portion located between subpixels SP1 which are adjacent to each other in the second direction Y in the second partition 6B. As another example, the slit SL may be provided in this portion.

Figure 22:
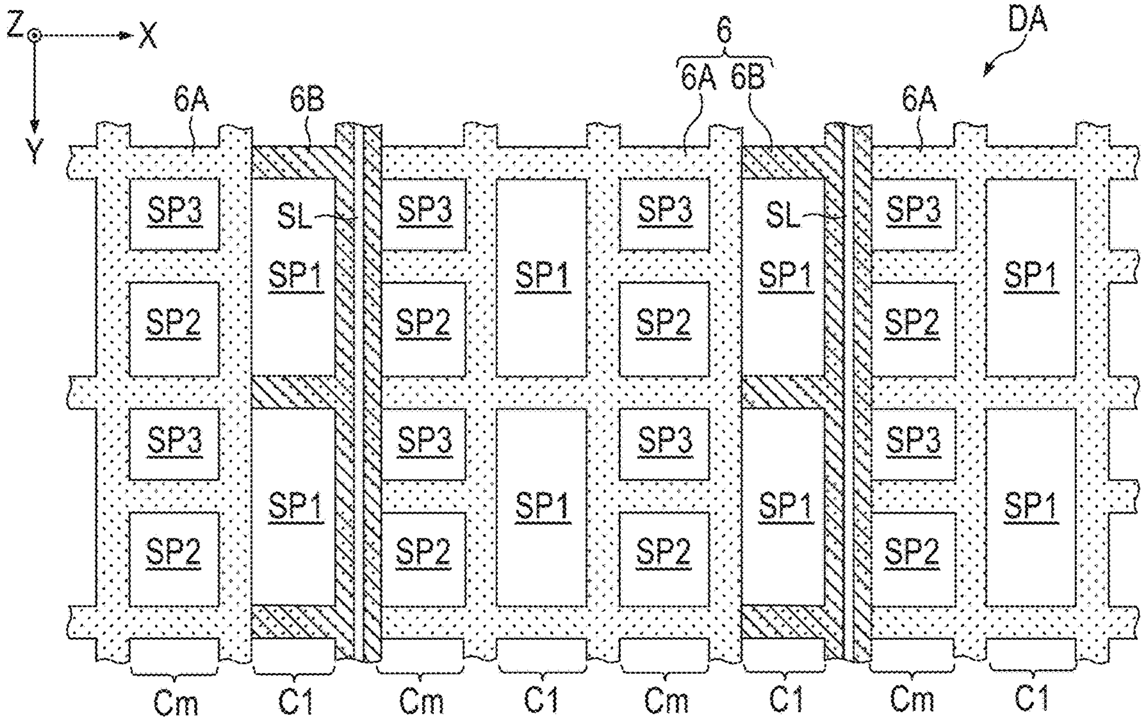
FIG. 22 is a schematic plan view of the first partition and the second partition according to a third modified example.

FIG. 22 is a schematic plan view of the first partition 6A and the second partition 6B according to a third modified example. The shape of each second partition 6B in the third modified example is the same as the second modified example. However, the number of second partitions 6B in the third modified example is reduced compared to the second modified example. In this configuration, several subpixels SP1, SP2 and SP3 do not face any second partition 6B in the display area DA.

Figure 23:
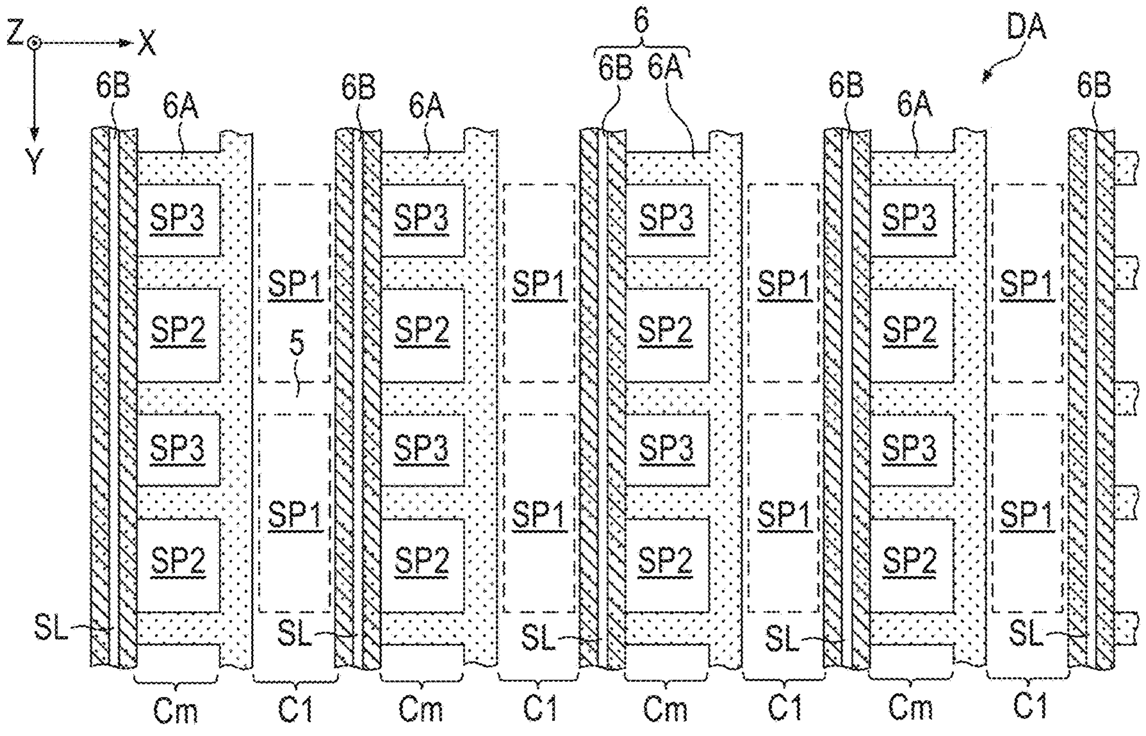
FIG. 23 is a schematic plan view of the first partition and the second partition according to a fourth modified example.

FIG. 23 is a schematic plan view of the first partition 6A and the second partition 6B according to a fourth modified example. In the fourth modified example, neither the first partition 6A nor the second partition 6B is provided between subpixels SP1 which are adjacent to each other in the second direction Y. Specifically, a plurality of subpixels SP1 which constitute each pixel column C1 are linearly arranged without intervention of the partition 6 between the first and second partitions 6A and 6B which are adjacent to each other in the first direction X. It should be noted that the rib 5 is provided between subpixels SP1 which are adjacent to each other in the second direction Y.

In this configuration, the partition 6 is divided along each pixel column C1. Thus, the resistance of the common electrode CE (see FIG. 9) consisting of the partition 6 and the upper electrodes UE1, UE2 and UE3 can be further increased.

Figure 24:
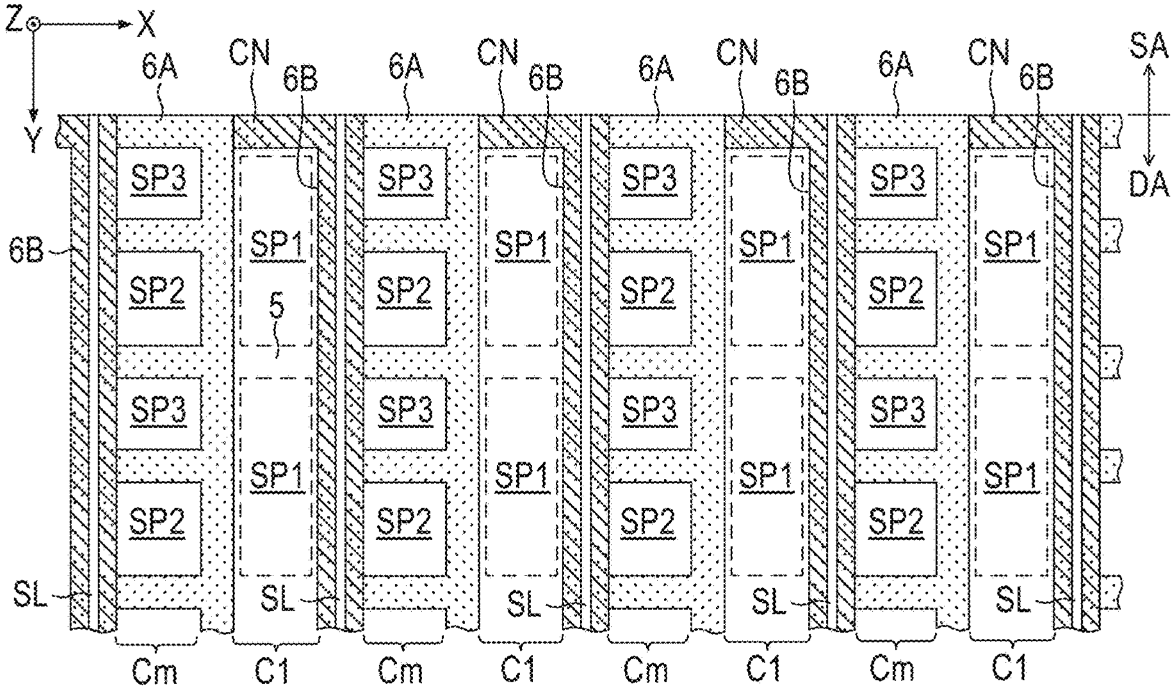
FIG. 24 is another schematic plan view of the first partition and the second partition according to the fourth modified example.

FIG. 24 is another schematic plan view of the first partition 6A and the second partition 6B according to the fourth modified example, and shows the vicinity of the boundary between the display area DA and the surrounding area SA. The partition 6 has connection portions CN each of which connects the first and second partitions 6A and 6B which are adjacent to each other via the pixel column C1. Each connection portion CN is located in, for example, an end portion of the display area DA in the second direction Y. By these connection portions CN, an end portion of each pixel column C1 in the second direction Y is closed.

In the example of FIG. 24, each connection portion CN consists of the second partition 6B. No slit SL is provided in each connection portion CN. As another example, the slit SL may be provided in each connection portion CN. Each connection portion CN may consist of the first partition 6A. The end portion of each pixel column C1 on the side opposite to the end portion shown in FIG. 24 in the second direction Y is also closed by a connection portion CN.

In each pixel column C1, the stacked film FL1 (the organic layer OR1, the upper electrode UE1 and the cap layer CP) and the sealing layer SE1 are continuous over a plurality of subpixels SP1. If the end portions of each pixel column C1 are not closed by the partition 6, it is difficult to seal the end portions of the stacked film FL1 with the sealing layer SE1. However, if the connection portions CN are provided, similarly, the stacked film FL1 can be satisfactorily sealed in the end portions of each pixel column C1.

Figure 25:
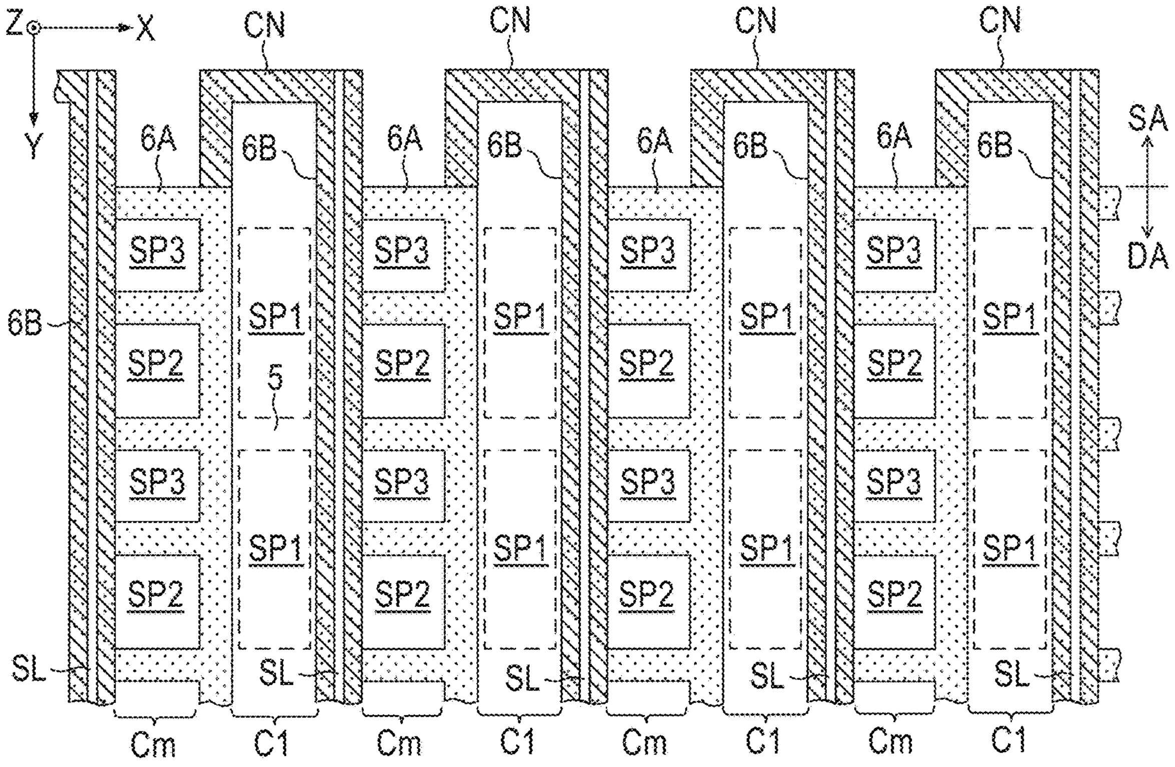
FIG. 25 is a schematic plan view showing another example of a connection portion according to the fourth modified example.

FIG. 25 is a schematic plan view showing another example of the connection portion CN according to the fourth modified example. In the example of this figure, each connection portion CN which consists of the second partition 6B protrudes to the surrounding area SA, is turned back in a U-shape, and is connected to the first partition 6A. In addition to this example, various configurations may be applied to the connection portions CN.

Figure 26:
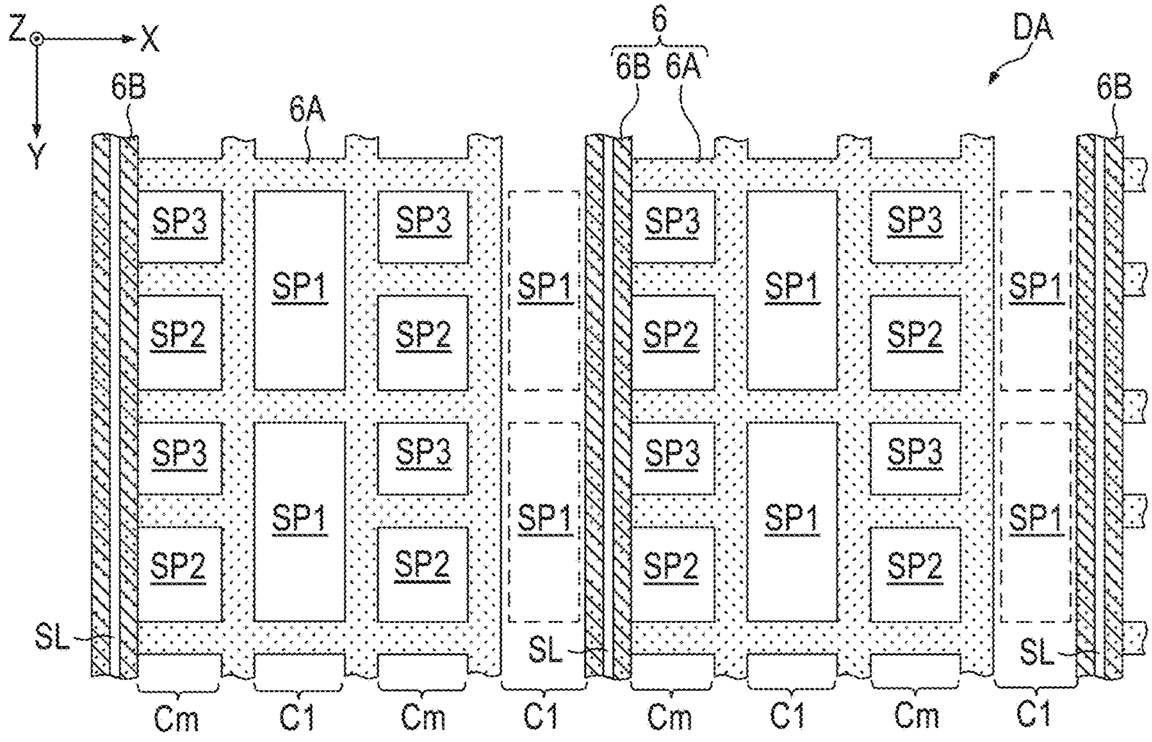
FIG. 26 is a schematic plan view of the first partition and the second partition according to a fifth modified example.

FIG. 26 is a schematic plan view of the first partition 6A and the second partition 6B according to a fifth modified example. In the fifth modified example, the number of second partitions 6B is reduced compared to the fourth modified example. In this configuration, several subpixels SP1, SP2 and SP3 do not face any second partition 6B in the display area DA.

Furthermore, the first partition 6A is provided between subpixels SP1 which are adjacent to each other in the second direction Y in each pixel column C1 consisting of subpixels SP1 which do not face any second partition 6B. The configuration is not limited to this example. The partition 6 may not be provided between subpixels SP1 which are adjacent to each other in the second direction Y in these pixel columns C1.

Figure 27:
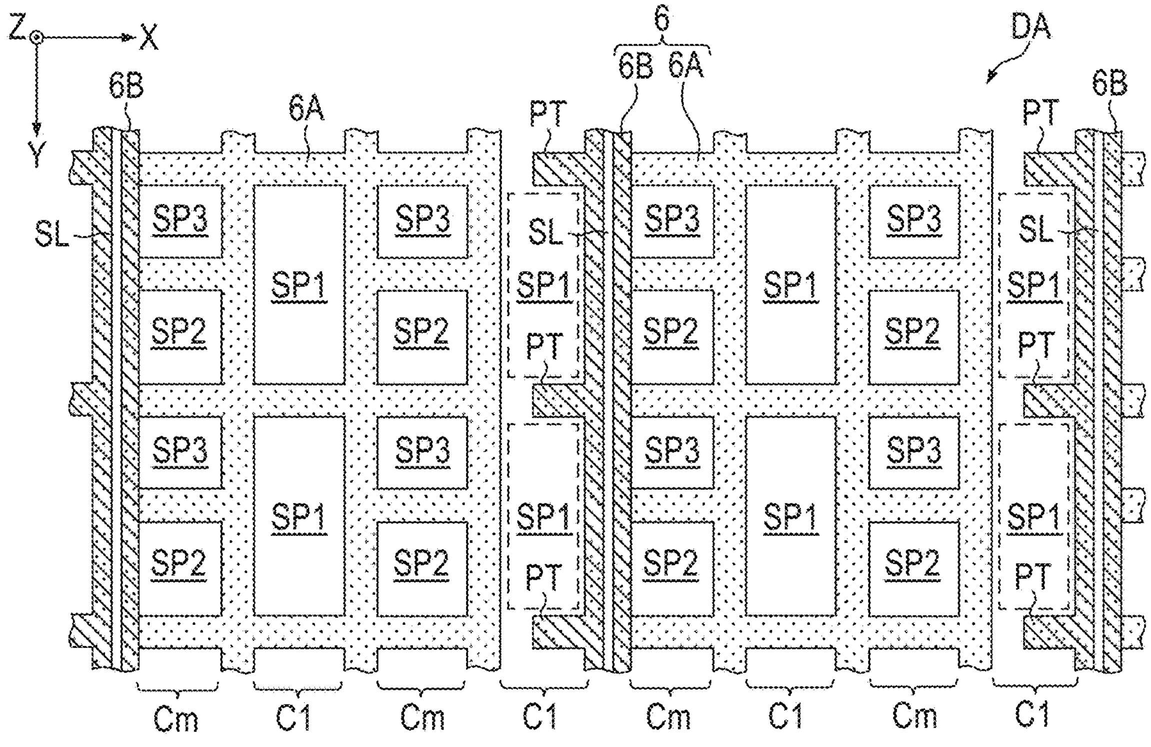
FIG. 27 is a schematic plan view of the first partition and the second partition according to a sixth modified example.

FIG. 27 is a schematic plan view of the first partition 6A and the second partition 6B according to a sixth modified example. The basic configuration of the sixth modified example is similar to that of the fifth modified example. However, each second partition 6B has a plurality of protrusions PT which protrude toward the first partition 6A. Each protrusion PT is located between subpixels SP1 which are adjacent to each other in the second direction Y. The distal end of each protrusion PT is spaced apart from the first partition 6A.

The provision of these protrusions PT can equalize the visual quality of each pixel column C1 located between the first partition 6A and the second partition 6B and each pixel column C1 surrounded by the first partition 6A over the whole circumference.

In FIG. 27, no slit SL is provided in each protrusion PT. As another example, the slit SL may be provided in each protrusion PT.

Figure 28:
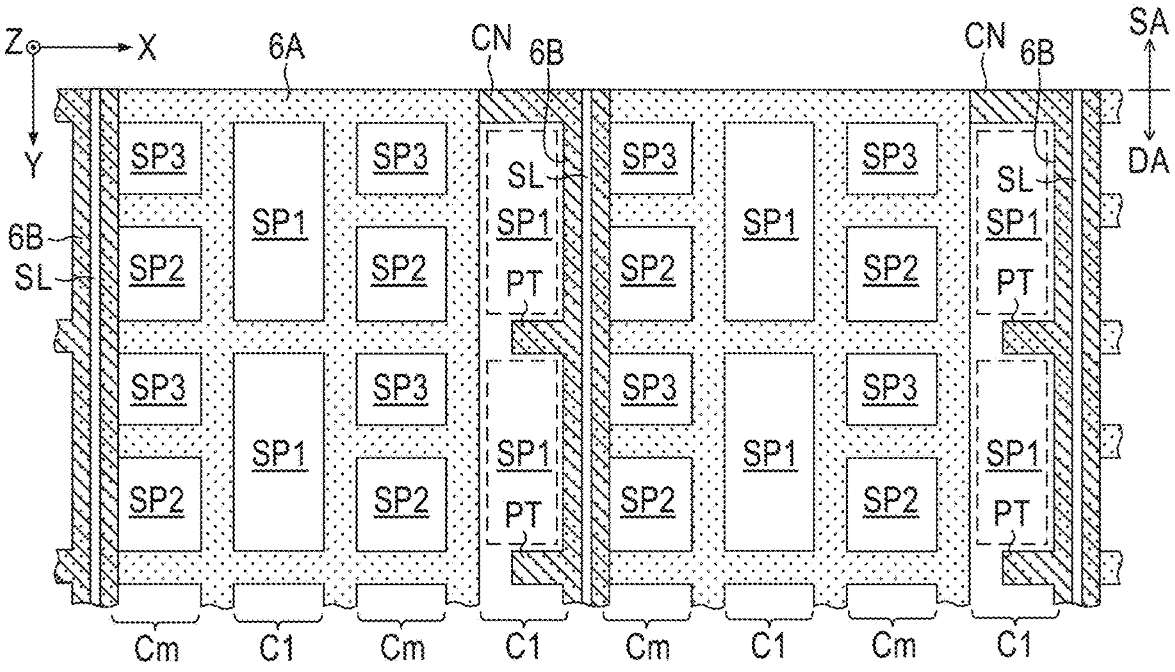
FIG. 28 is another schematic plan view of the first partition and the second partition according to the sixth modified example.

FIG. 28 is another schematic plan view of the first partition 6A and the second partition 6B according to the sixth modified example, and shows the vicinity of the boundary between the display area DA and the surrounding area SA. In the sixth modified example, similarly, an end portion of the pixel column C1 in the second direction Y is closed by the connection portion CN. The connection portion CN may consist of the second partition 6B as shown in FIG. 28 or may consist of the first partition 6A. The end portion of each pixel column C1 on the side opposite to the end portion shown in FIG. 28 in the second direction Y is also closed by a connection portion CN.

Figure 29:
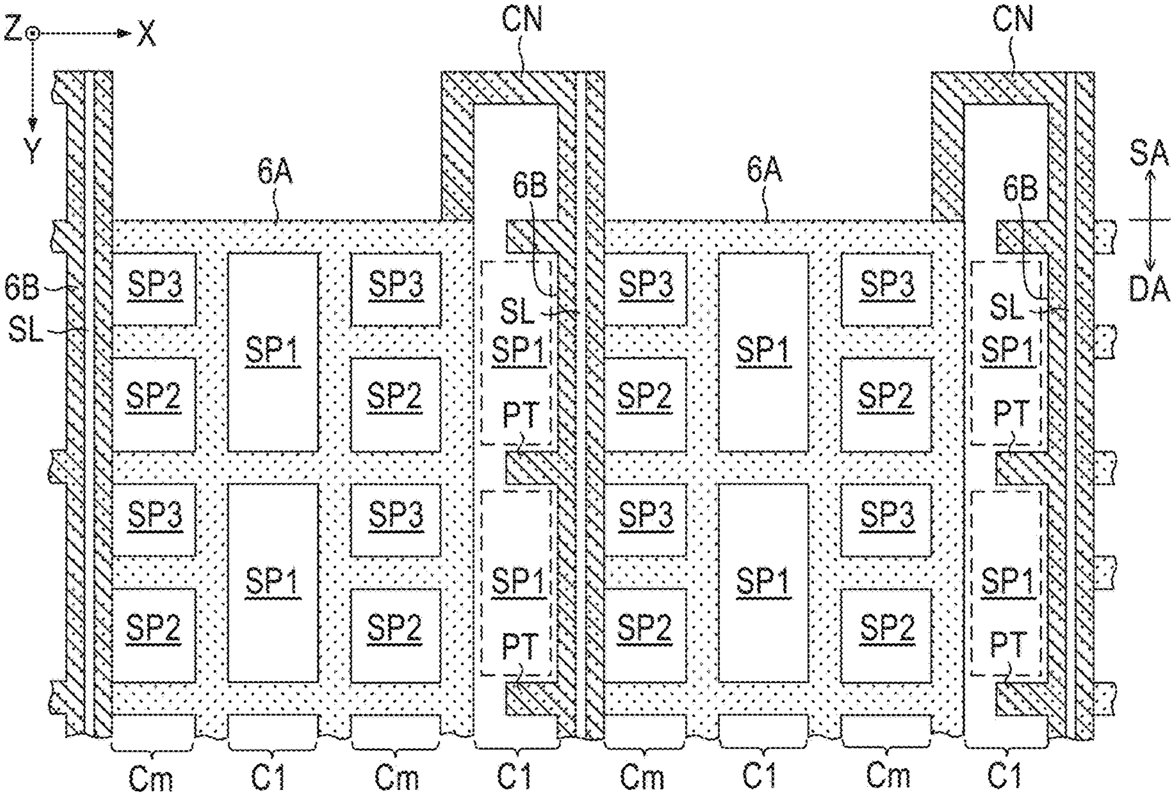
FIG. 29 is a schematic plan view showing another example of the connection portion according to the sixth modified example.

FIG. 29 is a schematic plan view showing another example of the connection portion CN according to the sixth modified example. In the example of this figure, each connection portion CN which consists of the second partition 6B protrudes to the surrounding area SA, is turned back in a U-shape, and is connected to the first partition 6A. In addition to this example, various configurations may be applied to the connection portions CN.

Figure 30:
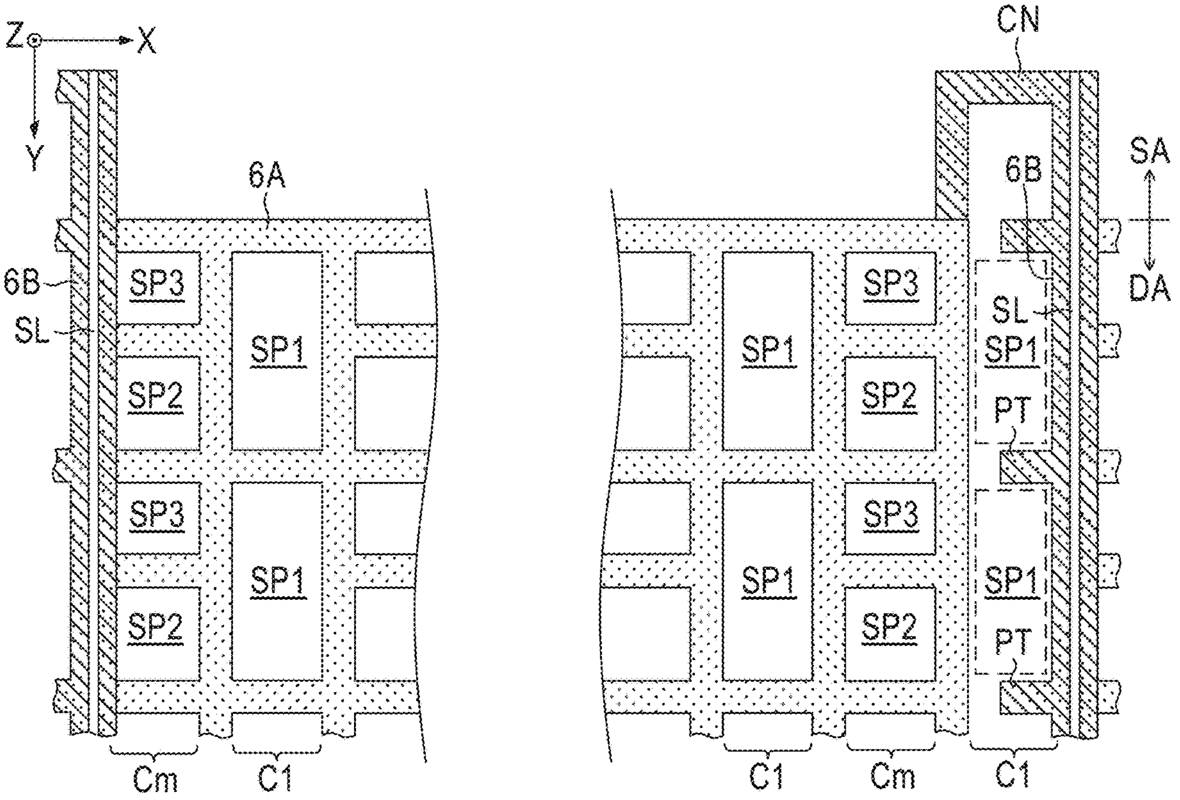
FIG. 30 is a schematic plan view of the first partition and the second partition according to a seventh modified example.

FIG. 30 is a schematic plan view of the first partition 6A and the second partition 6B according to a seventh modified example. Each second partition 6B shown in this figure has a planar shape similar to that of FIG. 29. However, the layout interval of the second partitions 6B in the first direction X is greater than that of FIG. 29. For example, when the number of pixels in the first direction X is 450 in a 1.4-inch display device DSP, the second partitions 6B could be provided at an interval which divides the screen into approximately 8 to 16 sections (approximately 56 to 28 pixels). It should be noted that the layout interval of the second partitions 6B may be appropriately determined in consideration of other factors such as the properties of the antenna stacked on the display device DSP.

Figure 31:
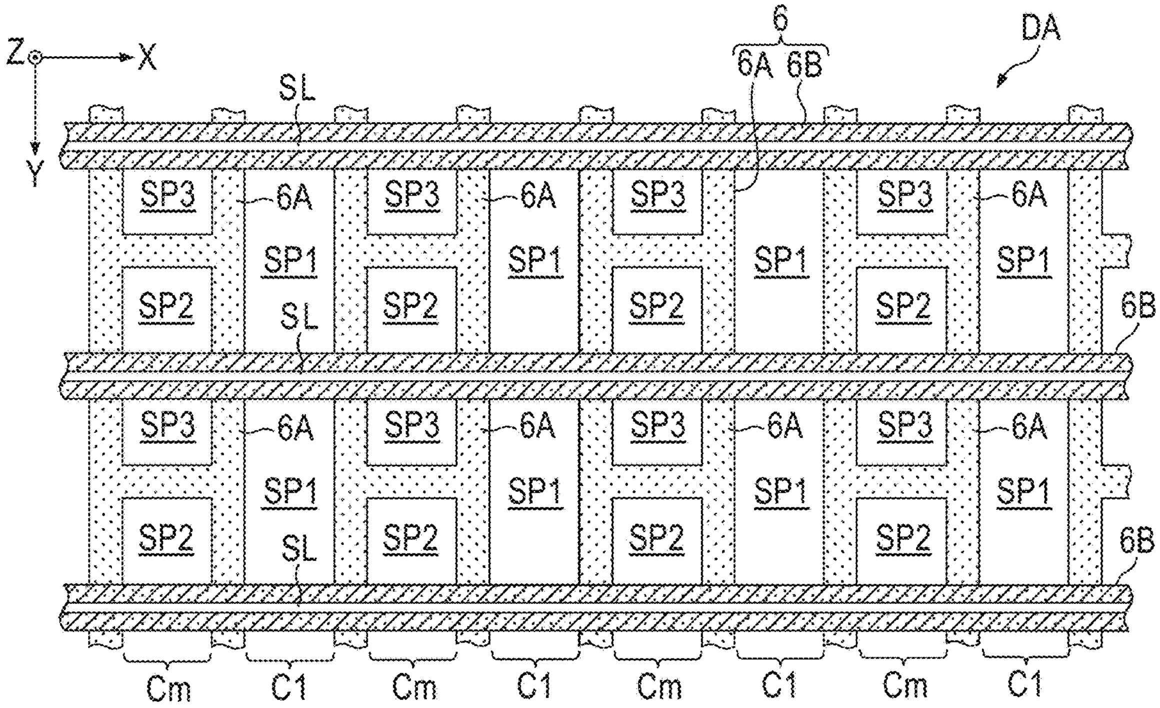
FIG. 31 is a schematic plan view of the first partition and the second partition according to an eighth modified example.

FIG. 31 is a schematic plan view of the first partition 6A and the second partition 6B according to an eighth modified example. In the eighth modified example, a plurality of second partitions 6B extend in the first direction X and are arranged at regular intervals in the second direction Y. Each slit SL also extends in the first direction X.

In each subpixel SP1, two sides face the second partitions 6B. In each of subpixels SP2 and SP3, one side faces the second partition 6B. It should be noted that the second partitions 6B may be provided at wider intervals. In the configurations of the other modified examples, similarly, the second partitions 6B may extend in the first direction X.

Figure 32:
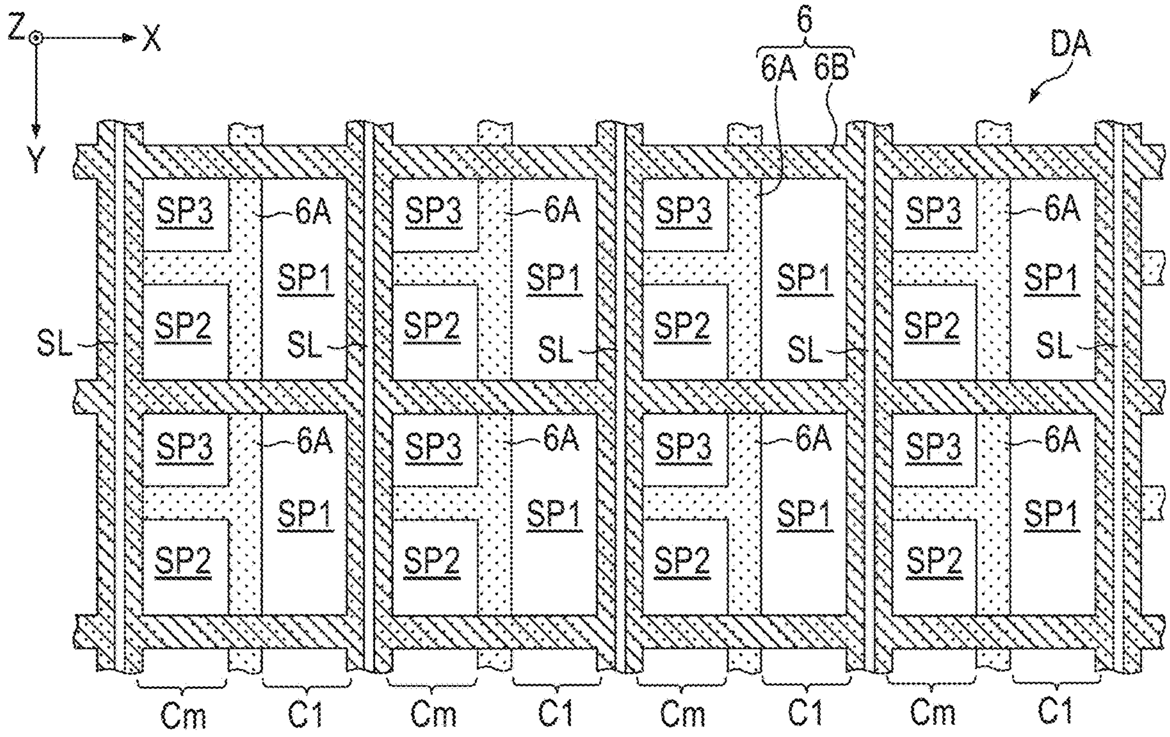
FIG. 32 is a schematic plan view of the first partition and the second partition according to a ninth modified example.

FIG. 32 is a schematic plan view of the first partition 6A and the second partition 6B according to a ninth modified example. In the ninth modified example, the second partition 6B has a grating shape. In each area surrounded by the second partition 6B, one subpixel SP1, one subpixel SP2 and one subpixel SP3 are provided. Further, the first partition 6A is provided in the boundaries of these subpixels SP1, SP2 and SP3. It should be noted that the second partition 6B may have a shape which surrounds more subpixels SP1, SP2 and SP3 in each closed area.

In FIG. 32, the slit SL is provided in each portion extending in the second direction Y in the second partition 6B. No slit SL is provided in each portion extending in the first direction X in the second partition 6B.

Figure 33:
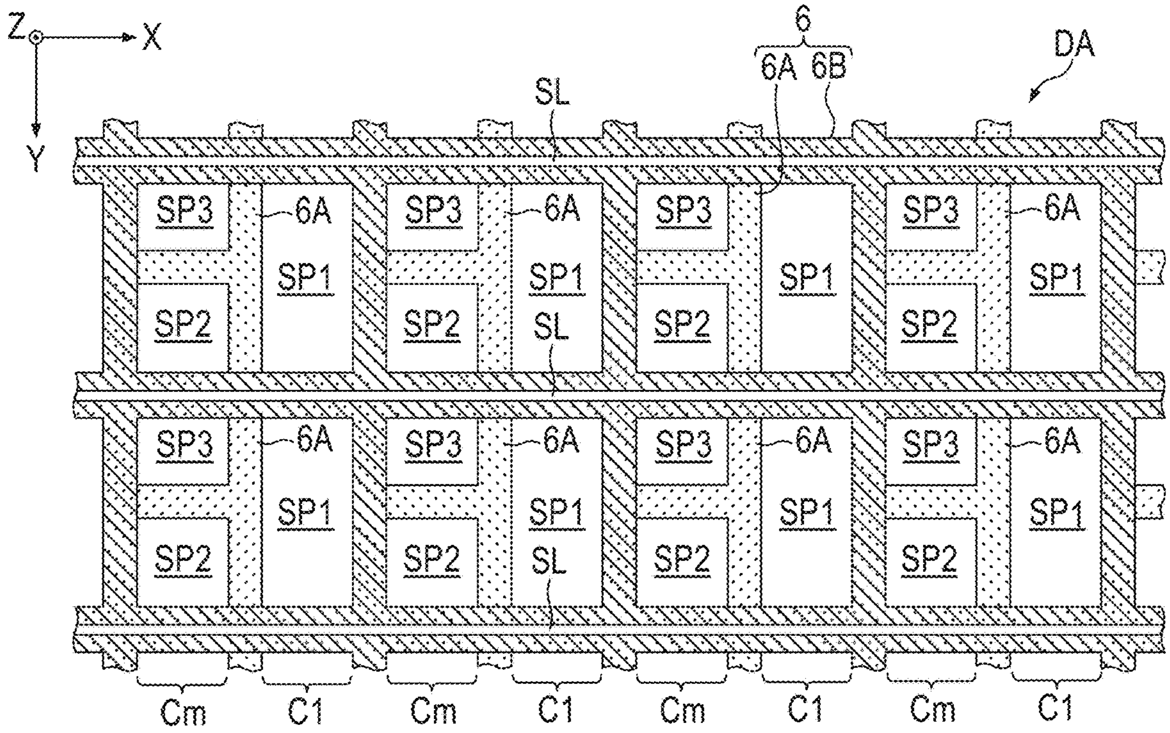
FIG. 33 is a schematic plan view of the first partition and the second partition according to a tenth modified example.

FIG. 33 is a schematic plan view of the first partition 6A and the second partition 6B according to a tenth modified example. The second partition 6B shown in this figure has a grating shape similar to that shown in FIG. 32. However, in the tenth modified example, the slit SL is provided in each portion extending in the first direction X in the second partition 6B. No slit SL is provided in each portion extending in the second direction Y in the second partition 6B.

Figure 34:
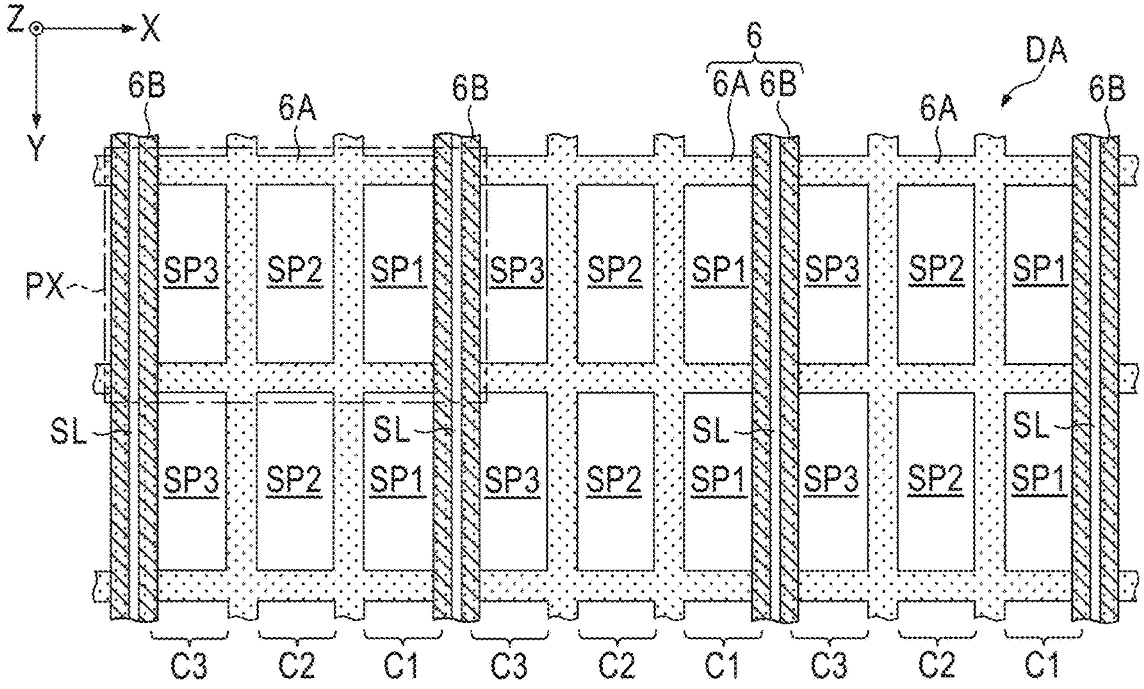
FIG. 34 is a schematic plan view of the first partition and the second partition according to an eleventh modified example.

FIG. 34 is a schematic plan view of the first partition 6A and the second partition 6B according to an eleventh modified example. In the eleventh modified example, subpixels SP1, SP2 and SP3 constituting each pixel PX are arranged in the first direction X. By this configuration, pixel columns C1 each of which includes a plurality of subpixels SP1 arranged in the second direction Y, pixel columns C2 each of which includes a plurality of subpixels SP2 arranged in the second direction Y and pixel columns C3 each of which includes a plurality of subpixels SP3 arranged in the second direction Y are formed in the display area DA.

In the example of FIG. 34, a plurality of partitions 6B extending in the second direction Y are provided at intervals in the first direction X, and the slit SL is provided for each second partition 6B. One pixel column C1, one pixel column C2 and one pixel column C3 are provided between the adjacent second partitions 6B. The first partition 6A is provided in the boundaries of subpixels SP1, SP2 and SP3 between the adjacent second partitions 6B.

It should be noted that, in the eleventh modified example, more pixel columns C1, C2 and C3 may be provided between the adjacent second partitions 6B. The second partitions 6B and the slits SL may extend in the first direction X.

Figure 35:
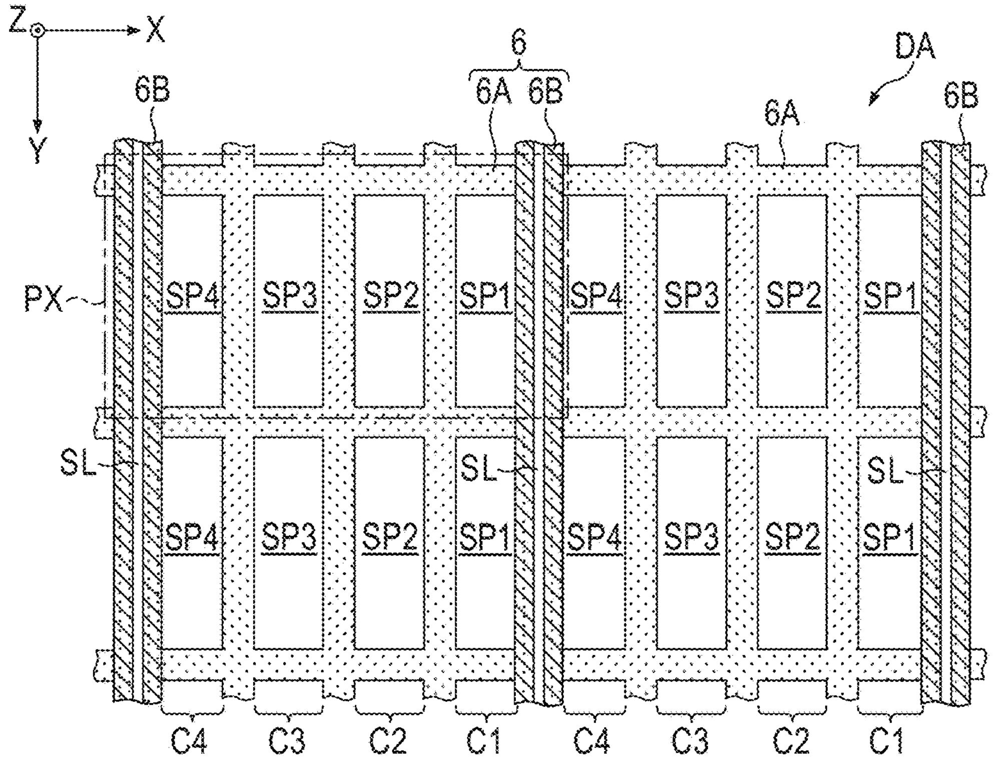
FIG. 35 is a schematic plan view of the first partition and the second partition according to a twelfth modified example.

FIG. 35 is a schematic plan view of the first partition 6A and the second partition 6B according to a twelfth modified example. In the twelfth modified example, each pixel PX further includes subpixel SP4 which displays a fourth color. For example, the fourth color is white. In addition to the pixel columns C1, C2 and C3, a pixel column C4 which includes a plurality of subpixels SP4 arranged in the second direction Y is formed in the display area DA.

In the example of FIG. 35, a plurality of partitions 6B extending in the second direction Y are provided at intervals in the first direction X, and the slit SL is provided for each second partition 6B. One pixel column C1, one pixel column C2, one pixel column C3 and one pixel column C4 are provided between the adjacent second partitions 6B. The first partition 6A is provided in the boundaries of subpixels SP1, SP2, SP3 and SP4 between the adjacent second partitions 6B.

It should be noted that, in the twelfth modified example, more pixel columns C1, C2, C3 and C4 may be provided between the adjacent second partitions 6B. The second partitions 6B and the slits SL may extend in the first direction X.

Figure 36:
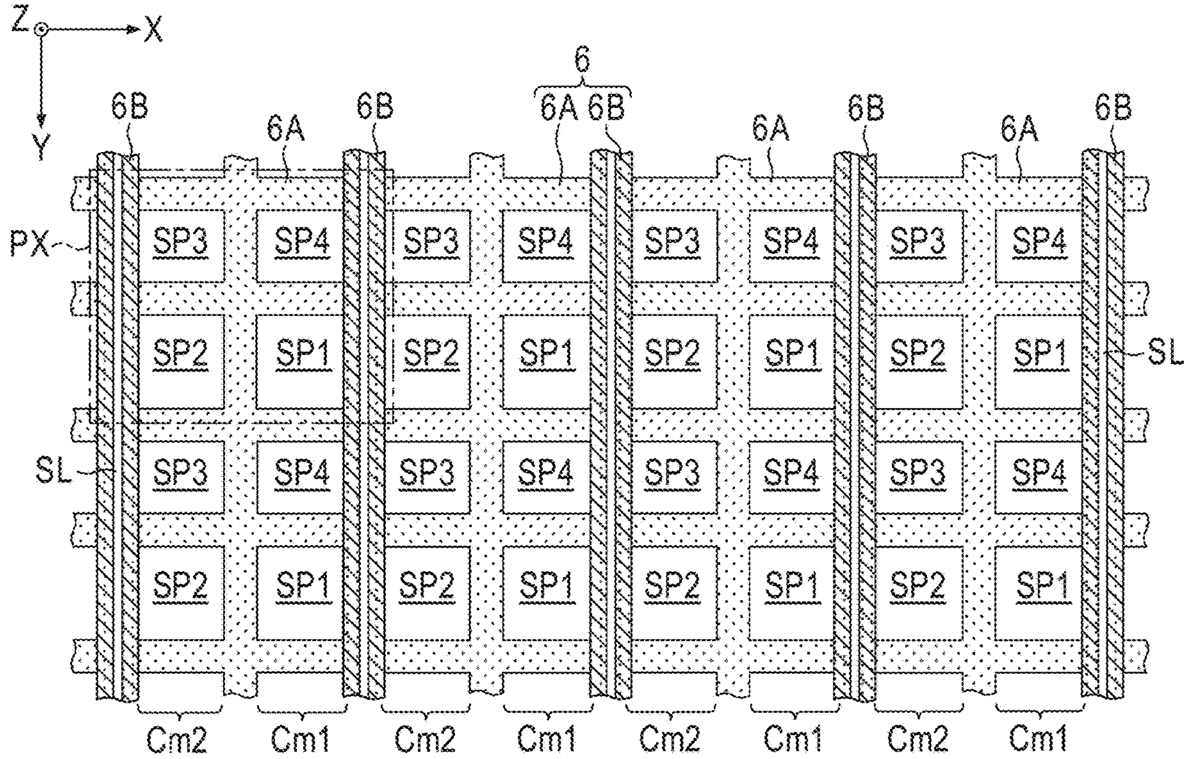
FIG. 36 is a schematic plan view of the first partition and the second partition according to a thirteenth modified example.

FIG. 36 is a schematic plan view of the first partition 6A and the second partition 6B according to a thirteenth modified example. In the thirteenth modified example, in a manner similar to that of the twelfth modified example, each pixel PX includes subpixels SP1, SP2, SP3 and SP4. In each pixel PX, subpixels SP1 and SP2 are arranged in the first direction X, and subpixels SP3 and SP4 are arranged in the first direction X. Further, subpixels SP1 and SP4 are arranged in the second direction Y, and subpixels SP2 and SP3 are arranged in the second direction Y. By this configuration, a pixel column Cm1 in which subpixels SP1 and SP4 are alternately arranged in the second direction Y and a pixel column Cm2 in which subpixels SP2 and SP3 are alternately arranged in the second direction Y are formed in the display area DA. It should be noted that the layout of subpixels SP1, SP2, SP3 and SP4 in each pixel PX could be appropriately changed.

In the example of FIG. 36, a plurality of second partitions 6B extending in the second direction Y are provided at intervals in the first direction X, and the slit SL is provided for each second partition 6B. One pixel column Cm1 and one pixel column Cm2 are provided between the adjacent second partitions 6B. The first partition 6A is provided in the boundaries of subpixels SP1, SP2, SP3 and SP4 between the adjacent second partitions 6B.

It should be noted that, in the thirteenth modified example, more pixel columns Cm1 and Cm2 may be provided between the adjacent second partitions 6B. The second partitions 6B and the slits SL may extend in the first direction X.

All of the display devices that can be implemented by a person of ordinary skill in the art through arbitrary design changes to the display device described above as the embodiments of the present invention come within the scope of the present invention as long as they are in keeping with the spirit of the present invention.

Various modification examples which may be conceived by a person of ordinary skill in the art in the scope of the idea of the present invention will also fall within the scope of the invention. For example, even if a person of ordinary skill in the art arbitrarily modifies the above embodiments by adding or deleting a structural element or changing the design of a structural element, or adding or omitting a step or changing the condition of a step, all of the modifications fall within the scope of the present invention as long as they are in keeping with the spirit of the invention.

Further, other effects which may be obtained from each embodiment and are self-explanatory from the descriptions of the specification or can be arbitrarily conceived by a person of ordinary skill in the art are considered as the effects of the present invention as a matter of course.

What is claimed is:

1. A display device comprising:

a plurality of subpixels each including a lower electrode, an upper electrode which faces the lower electrode, and an organic layer which is provided between the lower electrode and the upper electrode and emits light based on a potential difference between the lower electrode and the upper electrode; and a partition which includes a lower portion and an upper portion protruding from a side surface of the lower portion and surrounds each of the subpixels, wherein the partition comprises:

a first partition in which the lower portion includes first and second conductive layers which overlap each other; and a second partition in which the lower portion includes an insulating layer and the second conductive layer provided on the insulating layer, and a slit is provided in at least part of the second partition.

2. The display device of claim 1, wherein the slit divides the upper portion and the second conductive layer of the second partition, and does not divide the insulating layer.

3. The display device of claim 1, wherein the slit divides the upper portion, the second conductive layer and the insulating layer of the second partition.

4. The display device of claim 1, wherein at least one side faces the first partition in each of the subpixels.

5. The display device of claim 4, wherein the upper electrode of each of the subpixels is in contact with a side surface of the lower portion of the first partition.

6. The display device of claim 1, wherein the second partition has first and second portions divided from each other by the slit, and the organic layer and the upper electrode are not provided in a space between the first portion and the second portion.

7. The display device of claim 1, further comprising a rib having a pixel aperture in each of the subpixels, wherein the partition is provided on the rib, and a width of a portion of the rib located under the second partition in which the slit is provided is greater than a width of a portion of the rib located under the first partition.

8. The display device of claim 1, wherein the partition includes a plurality of second partitions extending parallel to each other, and the slit is provided for at least one of the second partitions and extends in an extension direction of the second partitions.

9. The display device of claim 1, wherein the subpixels include a plurality of first subpixels which display a first color, a plurality of second subpixels which display a second color, and a plurality of third subpixels which display a third color, an aperture ratio of each of the first subpixels is greater than an aperture ratio of each of the second subpixels and an aperture ratio of each of the third subpixels, and at least one side of each of the first subpixels faces the second partition.

10. The display device of claim 9, wherein the first subpixels are linearly arranged between the first partition and the second partition, and the partition is not provided between the adjacent first subpixels.

11. The display device of claim 9, wherein the first subpixels are linearly arranged between the first partition and the second partition, the second partition has a protrusion which extends toward the first partition between the adjacent first subpixels, and a distal end of the protrusion is spaced apart from the first partition.

12. A display device comprising:

a plurality of subpixels each including a lower electrode, an upper electrode which faces the lower electrode, and an organic layer which is provided between the lower electrode and the upper electrode and emits light based on a potential difference between the lower electrode and the upper electrode; and a partition which includes a lower portion and an upper portion protruding from a side surface of the lower portion, and surrounds each of the subpixels, wherein the partition comprises:

a first partition in which the lower portion has a first height; and a second partition in which the lower portion has a second height less than the first height, and a slit is provided in at least part of the second partition.

13. The display device of claim 12, wherein at least one side faces the first partition in each of the subpixels.

14. The display device of claim 13, wherein the upper electrode of each of the subpixels is in contact with a side surface of the lower portion of the first partition.

15. The display device of claim 12, wherein the second partition has first and second portions divided from each other by the slit, and the organic layer and the upper electrode are provided in a space between the first portion and the second portion.

16. The display device of claim 12, further comprising a rib having a pixel aperture in each of the subpixels, wherein the partition is provided on the rib, and a width of a portion of the rib located under the second partition in which the slit is provided is greater than a width of a portion of the rib located under the first partition.

17. The display device of claim 12, wherein the partition includes a plurality of second partitions extending parallel to each other, and the slit is provided for at least one of the second partitions, and extends in an extension direction of the second partitions.

18. The display device of claim 12, wherein the subpixels include a plurality of first subpixels which display a first color, a plurality of second subpixels which display a second color and a plurality of third subpixels which display a third color, an aperture ratio of each of the first subpixels is greater than an aperture ratio of each of the second subpixels and an aperture ratio of each of the third subpixels, and at least one side of each of the first subpixels faces the second partition.

19. The display device of claim 18, wherein the first subpixels are linearly arranged between the first partition and the second partition, and the partition is not provided between the adjacent first subpixels.

20. The display device of claim 18, wherein the first subpixels are linearly arranged between the first partition and the second partition, the second partition has a protrusion which extends toward the first partition between the adjacent first subpixels, and a distal end of the protrusion is spaced apart from the first partition.

* * * * *